United States Patent
Shibata et al.

(10) Patent No.: US 6,649,943 B2
(45) Date of Patent: Nov. 18, 2003

(54) GROUP III NITRIDE COMPOUND SEMICONDUCTOR LIGHT-EMITTING ELEMENT

(75) Inventors: Naoki Shibata, Aichi (JP); Takahiro Kozawa, Aichi (JP); Kazuyoshi Tomita, Aichi (JP); Tetsu Kachi, Aichi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 10/163,088

(22) Filed: Jun. 6, 2002

(65) Prior Publication Data
US 2003/0001170 A1 Jan. 2, 2003

(30) Foreign Application Priority Data
Jun. 7, 2001 (JP) .......................... 2001-171870

(51) Int. Cl.$^7$ ......................................... H01L 31/0328
(52) U.S. Cl. ................. 257/189; 257/188; 257/79; 257/88; 257/89; 257/86; 257/87
(58) Field of Search ..................... 257/189, 188, 257/79, 88, 89, 86, 87

(56) References Cited

U.S. PATENT DOCUMENTS

| | | | | |
|---|---|---|---|---|
| 5,652,438 A | * | 7/1997 | Sassa et al. ..................... 257/94 |
| 5,689,123 A | * | 11/1997 | Major et al. ..................... 257/190 |
| 5,945,689 A | * | 8/1999 | Koike et al. ..................... 257/88 |
| 6,288,416 B1 | * | 9/2001 | Koike et al. ..................... 257/94 |
| 6,462,354 B1 | * | 10/2002 | Okuyama ..................... 257/13 |

FOREIGN PATENT DOCUMENTS

| | | |
|---|---|---|
| JP | H8-167737 | 6/1996 |
| JP | H10-12916 | 1/1998 |
| JP | H10-22525 | 1/1998 |
| JP | H10-22527 | 1/1998 |

* cited by examiner

Primary Examiner—Michael S. Lebentritt
Assistant Examiner—Douglas Menz
(74) Attorney, Agent, or Firm—McGinn & Gibb, PLLC

(57) ABSTRACT

Disclosed is a Group III nitride compound semiconductor light-emitting element formed of Group III nitride compound semiconductor layers, including a multi-layer containing light-emitting layers; a p-type semiconductor layer; and an n-type semiconductor layer, wherein the multi-layer includes a multiple quantum barrier-well layer containing quantum-barrier-formation barrier layers formed from a Group III nitride compound semiconductor and quantum-barrier-formation well layers formed from a Group III nitride compound semiconductor, the barrier layers and the well layers being laminated alternately and cyclically, and a plurality of low-energy-band-gap layers which emit light of different wavelengths; and the multiple quantum barrier-well layer is provided between the low-energy-band-gap layers.

20 Claims, 13 Drawing Sheets

(N-TYPE SEMICONDUCTOR LAYER 104)

MQW   MQW

GROUP III NITRIDE COMPOUND SEMICONDUCTOR LIGHT-EMITTING ELEMENT

This is a patent application based on a Japanese patent application No. 2001-171870 which was filed on Jun. 7, 2001 and which is incorporated herein by reference.

BACKGROUND OF THE INVENTION

1. Field of the Invention

The present invention relates to a Group III nitride compound semiconductor light-emitting element containing a plurality of low-energy-band-gap layers which emit light of different wavelengths.

2. Background Art

In order to attain mass production of, for example, white LEDs, many studies have heretofore focused on semiconductor light-emitting elements containing a plurality of low-energy-band-gap layers which emit light of different wavelengths.

FIG. 13 shows energy band diagrams of conventional semiconductor light-emitting elements, each containing two low-energy-band-gap layers which emit light of different wavelengths.

FIG. 13A shows an energy band diagram of a semiconductor light-emitting element containing two low-energy-band-gap layers which emit light of wavelengths that are arbitrarily or appropriately different, and containing no quantum-barrier-formation barrier layer between the low-energy-band-gap layers. FIG. 13B shows an energy band diagram of a semiconductor light-emitting element containing two low-energy-band-gap layers which emit light of wavelengths that are arbitrarily or appropriately different, and containing a simple quantum-barrier-formation barrier layer between the low-energy-band-gap layers.

As shown in FIG. 13A, when no quantum-barrier-formation barrier layer is provided between the two low-energy-band-gap layers, electrons and holes tend to migrate to the layer having lower band gap energy; i.e., the layer which emits light of long wavelength. Therefore, difficulty is encountered in "obtaining a desired ratio of emission intensity between the low-energy-band-gap layers"; for example, causing the two low-energy-band-gap layers to emit at substantially the same intensity. Therefore, a desired light color is difficult to obtain by mixing emitted light of different colors.

As shown in FIG. 13B, when a simple barrier layer is provided between the two low-energy-band-gap layers, electrons are easily distributed to one of the low-energy-band-gap layers and holes are easily distributed to the other. Therefore, even when a desired emission intensity ratio is obtained, emission efficiency is lowered at the two low-energy-band-gap layers. That is, the resultant semiconductor element fails to exhibit sufficient emission intensity and emission efficiency.

As shown in FIGS. 13A and 13B, when overflow of carriers is effectively prevented by increasing energy barriers of p-type and n-type semiconductor layers provided on the two low-energy-band-gap layers, the p-type and n-type semiconductor layers must be increased in thickness, and the semiconductor layers must also be increased in aluminum (Al) content. As a result, the semiconductor element is prone to cracking.

SUMMARY OF THE INVENTION

In view of the foregoing, an object of the present invention is to provide a semiconductor light-emitting element containing a plurality of low-energy-band-gap layers which emit light of different wavelengths, which easily attains "desired proportions in emission intensity between the low-energy-band-gap layers" and which exhibits excellent emission efficiency and durability.

In order to achieve the above object, the present invention employs the following means.

According to first means of the present invention, there is provided a Group III nitride compound semiconductor light-emitting element formed of Group III nitride compound semiconductor layers, comprising multiple layers containing light-emitting layers (hereinafter collectively called "a multi-layer containing light-emitting layers" or "a multi-layer"), a p-type semiconductor layer, and an n-type semiconductor layer, wherein the multi-layer comprises a multiple quantum barrier-well layer containing quantum-barrier-formation barrier layers formed from a Group III nitride compound semiconductor and quantum-barrier-formation well layers formed from a Group III nitride compound semiconductor, the barrier layers and the well layers being laminated alternately and cyclically, and a plurality of low-energy-band-gap layers which emit light of different wavelengths; and the multiple quantum barrier-well layer is provided between the low-energy-band-gap layers. Here "low-energy band gap layer" also includes a well layer.

As used herein, the expression "Group III nitride compound semiconductor" encompasses binary, ternary, and quaternary semiconductors of arbitrary compositional proportions represented by the following formula: $Al_xGa_yIn_{(1-x-y)}N$ ($0 \leq x \leq 1$, $0 \leq y \leq 1$, $0 \leq x+y \leq 1$); and semiconductors containing trace amounts or small amounts of p-type or n-type impurities, the impurities having substantially no effect on the compositional proportions x and y.

Therefore, the expression "Group III nitride compound semiconductor" encompasses binary and ternary Group III nitride compound semiconductors, such as AlN, GaN, InN, AlGaN of arbitrary or appropriate compositional proportions, AlInN of arbitrary or appropriate compositional proportions, and GaInN of arbitrary or appropriate compositional proportions; and semiconductors containing trace amounts or small amounts of p-type or n-type impurities, the impurities having substantially no effect on the compositional proportions.

The expression "Group III nitride compound semiconductor" encompasses semiconductors in which the aforementioned Group III element (Al, Ga, or In) is partially substituted by boron (B) or thallium (Tl), or in which nitrogen (N) is partially substituted by phosphorus (P), arsenic (As), antimony (Sb), or bismuth (Bi).

Examples of the aforementioned p-type impurity include magnesium (Mg) and calcium (Ca).

Examples of the aforementioned n-type impurity include silicon (Si), sulfur (S), selenium (Se), tellurium (Te), and germanium (Ge).

These impurities may be incorporated in combination of two or more species, and a p-type impurity and an n-type impurity may be incorporated in combination.

The aforementioned low-energy-band-gap layer may have an SQW structure or an MQW structure.

FIG. 1 illustrates the function of a multiple quantum barrier-well layer employed in the present invention. FIG. 1A shows an energy band diagram of the multiple quantum barrier-well layer. In FIG. 1A, reference letter Wb represents the thickness of a quantum-barrier-formation barrier layer constituting the multiple quantum barrier-well layer, Ww represents the thickness of a quantum-barrier-formation well layer constituting the multiple quantum barrier-well layer, and Vb represents the energy level of the quantum-barrier-formation barrier layer.

When electrons are applied to the multiple quantum barrier-well layer from the left side of the drawing as shown in FIG. 1A, the probability that the electrons are reflected to the left side (i.e., reflectance) is classically thought to be as shown in FIG. 1B. In FIGS. 1B and 1C, reference letter E on the x-axis represents the kinetic energy of electrons applied in a forward direction.

However, in reality, electrons behave on the basis of the quantum theory. Therefore, by virtue of the tunnel effect or interference of electronic waves, the reflectance of electrons to the multiple quantum barrier-well layer substantially corresponds to the results of a quantum-theoretical simulation shown in FIG. 1C. In FIG. 1C, me (=0.2) represents the ratio of the effective mass of conduction electrons to the rest mass of electrons in the multiple quantum barrier-well layer, the ratio being employed in the simulation.

When "d" represents the length of ½ the lamination cycle of each of the quantum-barrier-formation barrier layers constituting the multiple quantum barrier-well layer (2.5 nm in the case shown in FIG. 1) and "λ" represents the wavelength of conduction electrons injected to the multiple quantum barrier-well layer, conduction electrons satisfying the following relations exhibit high reflectance: $d=\lambda/4$, $d=3\lambda/4$.

In contrast, conduction electrons satisfying the following relation exhibit low reflectance: $d=\lambda/2$.

When the multiple quantum barrier-well layer exerting the aforementioned barrier effect is introduced, the height of an effective quantum barrier becomes considerably greater than that of a classical quantum barrier. In addition, conduction electrons having a specific kinetic energy E selectively pass through the multiple quantum barrier-well layer by virtue of the tunnel effect, even when the energy level of the conduction electrons is lower than the height of the classical quantum barrier. For example, as shown in FIG. 1C, conduction electrons satisfying the following relation: $\lambda=2d=5$ nm (i.e., conduction electrons having a kinetic energy E of about 0.3 eV) exhibit low reflectance by virtue of the tunnel effect.

Therefore, in the case where the aforementioned multiple quantum barrier-well layer is employed, even when the amount of Al contained in p-type and n-type semiconductor layers is reduced, and these semiconductor layers are of reduced thickness as compared with conventional p-type and n-type semiconductor layers, overflow of carriers is effectively prevented, and optimal or suitable distribution of the carriers to low-energy-band-gap layers is realized. Thus, as compared with a conventional light-emitting element, the resultant semiconductor element emitting light of different wavelengths exhibits excellent emission efficiency and durability.

FIG. 2 is an energy band diagram illustrating the effect of the multiple quantum barrier-well layer of the semiconductor light-emitting element of the present invention. In FIG. 2, filled circles and open circles symbolically represent electrons and holes, respectively.

As shown in FIG. 2, when the multiple quantum barrier-well layer is provided between two low-energy-band-gap layers which emit light whose wavelengths are arbitrarily or appropriately different, distribution of electrons is determined on the basis of the quantum-theoretical effect as shown in FIG. 1. Distribution of holes is determined as shown in FIG. 2, and is similar to the distribution of electrons.

Therefore, when an appropriate multiple quantum barrier-well layer from which carriers having a specific kinetic energy E are reflected at a specific reflectance is employed in the first means of the present invention, the semiconductor light-emitting element containing a plurality of low-energy-band-gap layers which emit light of different wavelengths easily attains "desired proportions in carrier distribution (emission intensity) between the low-energy-band-gap layers" and exhibits excellent emission efficiency and durability.

Since the aforementioned multiple quantum barrier-well layer exerts the effect of reducing stress applied to the low-energy-band-gap layers, the stress being attributed to strain in the light-emitting element, semiconductor layers of good crystallinity are grown, and the low-energy-band-gap layers, etc. maintain a high level of crystallinity. According to the first means, when the thicknesses, lamination cycles, compositional proportions, and number of semiconductor layers constituting the multiple quantum barrier-well layer are optically or suitably determined in accordance with the kinetic energy of carriers, the carriers can assume substantially uniform distribution between a plurality of the low-energy-band-gap layers, or desired proportions in carrier distribution between the low-energy-band-gap layers can be attained. More specifically, the following means are effective.

In second means of the present invention, preferably, the band gap of each of the quantum-barrier-formation barrier layers is determined to be larger than that corresponding to the wavelength of light emitted from each of the low-energy-band-gap layers.

In third means of the present invention, preferably, the thickness of each of the quantum-barrier-formation well layers or each of the quantum-barrier-formation barrier layers is determined to be 0.5 nm to 10 nm inclusive.

In fourth means of the present invention, preferably, each of the quantum-barrier-formation well layers is formed from $Al_xGa_yIn_{1-x-y}N$ ($0 \leq x < 0.1$, $0.8 < y < 1$, $0 < 1-x-y < 0.1$).

In fifth means of the present invention, preferably, each of the quantum-barrier-formation barrier layers is formed from $Al_xGa_{1-x}N$ ($0 \leq x < 0.5$).

In order to obtain light of a desired color from the semiconductor light-emitting element of the present invention, the aforementioned second through fifth means may be arbitrarily selected and effectively employed in combination.

For example, the multiple quantum barrier-well layer may have a structure in which the quantum-barrier-formation barrier layers, each having a band gap larger than that corresponding to the wavelength of light emitted from each of the low-energy-band-gap layers, are laminated cyclically. Alternatively, the multiple quantum barrier-well layer may have a structure in which each of the quantum-barrier-formation well layers is formed from $Al_xGa_yIn_{1-x-y}N$ ($0 \leq x < 0.1$, $0.8 < y < 1$, $0 < 1-x-y < 0.1$), each of the quantum-barrier-formation barrier layers is formed from $Al_xGa_{1-x}N$ ($0 \leq x < 0.5$), each of the quantum-barrier-formation well layers and the quantum-barrier-formation barrier layers is determined to have a thickness of 0.5 nm to 10 nm inclusive, and the quantum-barrier-formation well layers and the quantum-barrier-formation barrier layers are laminated cyclically. When the multiple quantum barrier-well layer having such a structure is employed, carriers can be assume a substantially uniform distribution between a plurality of the low-energy-band-gap layers which emit light of different wavelengths, or desired proportions in carrier distribution between the low-energy-band-gap layers can be attained. Therefore, according to the aforementioned means, light of a desired color can be obtained from the semiconductor light-emitting element.

FIG. 3 is a graph showing criteria for forming a suitable or optimal multiple quantum barrier-well layer. For example, when the quantum-barrier-formation well layers of the multiple quantum barrier-well layer are formed from $Al_xGa_yIn_{(1-x-y)}N$ ($0 \leq x < 0.1$, $0.8 < y \leq 1-x-y < 0.1$), and the quantum-barrier-formation barrier layers of the multiple quantum barrier-well layer are formed from $Al_xGa_{1-x}N$ ($0 \leq x < 0.5$), the transmittance of carriers (electrons and holes) becomes as shown in FIG. 3.

The relation shown in FIG. 3 is obtained under the following conditions.

(Condition 1) the ratio of the effective mass of conduction electrons to the rest mass of electrons in the multiple quantum barrier-well layer: me=0.2

(Condition 2) lamination cycle of the quantum-barrier-formation barrier layer: twice the thickness of the quantum-barrier-formation barrier layer (Wb=Ww)

(Condition 3) the number of quantum-barrier-formation barrier layers: 8

(Condition 4) operation voltage: 3 V (Condition 5) temperature of the light-emitting element: about ambient temperature (Condition 6) kinetic energy of conduction electrons in an incident direction: about 0.2 to 0.5 eV As shown in FIG. 3, when the quantum-barrier-formation barrier layer has a thickness of 2.5 nm, and the compositional proportion of Al contained in the quantum-barrier-formation barrier layer is 0.3; i.e., x=0.3, the transmittance of carriers becomes about ½. Therefore, carriers can assume substantially uniform distribution between the low-energy-band-gap layers provided on the respective surfaces of the multiple quantum barrier-well layer.

In the case where a plurality of multiple quantum barrier-well layers are provided between three or more low-energy-band-gap layers (each of the multiple quantum barrier-well layers is provided between the low-energy-band-gap layers), when the transmittance of carriers which pass through each of the multiple quantum barrier-well layers is optimally or suitably determined such that the carriers are distributed to the low-energy-band-gap layers in desired proportions, light of uniform intensity can be obtained from the low-energy-band-gap layers, or desired proportions in emission intensity between the low-energy-band-gap layers can be attained.

Such optimization may be carried out by means of, for example, calculation for obtaining proportions of carriers having a specific kinetic energy distributed to the low-energy-band-gap layers, on the basis of the transmittance of the carriers which pass through the respective multiple quantum barrier-well layers. Alternatively, such optimization may be carried out on the basis of the results of a variety of simulations and tests.

As described above, when the means of the present invention is employed, in the semiconductor light-emitting element containing a plurality of low-energy-band-gap layers which emit light of different wavelengths, quantitative optimization for improving emission efficiency and attaining desired proportions in emission intensity between the low-energy-band-gap layers; i.e., regulating color of emitted light, can be carried out easily.

Each of the aforementioned conditions 1 through 6 is not a necessary condition for the present invention. Therefore, there may be employed any multiple quantum barrier-well layer satisfying the following relation: Wb>Ww; i.e., a multiple quantum barrier-well layer containing a quantum-barrier-formation barrier layer having a thickness greater than that of a quantum-barrier-formation well layer.

That is, the aforementioned conditions 1 through 6 may be optimally or suitably varied in accordance with desired properties of the light-emitting element.

In sixth means of the present invention, preferably, operation voltage is varied to thereby change the color of emitted light.

As is clear from FIG. 1, the transmittance of electrons which pass through the multiple quantum barrier-well layer or the reflectance of electrons depends on, for example, the kinetic energy of the electrons. Furthermore, as shown by the aforementioned condition 4, the transmittance or reflectance depends on the operation voltage of the light-emitting element. Therefore, when the operation voltage of the light-emitting element is varied, carriers can be distributed to the low-energy-band-gap layers in arbitrary proportions. In addition, when the operation voltage of the light-emitting element is varied, proportions in emission intensity between the low-energy-band-gap layers can be regulated.

The color of light emitted from the light-emitting element is determined by colors of light emitted from the low-energy-band-gap layers; i.e., proportions of intensities of light emitted from the low-energy-band-gap layers. Therefore, according to the sixth means, the color of light emitted from the light-emitting element can be varied.

As described above, when carriers are distributed to the low-energy-band-gap layers in desired proportions, the semiconductor light-emitting element (i.e., single-chip-type element) can emit light of desired color by appropriately regulating operation voltage.

A conventional outdoor large-screen television employs three types of LEDs; i.e., a red LED, a green LED, and a blue LED. However, when the semiconductor light-emitting element (i.e., single-chip-type element) which emits light of desired color is employed, such a large-screen television may be produced from only one or two types of LEDs.

In seventh means of the present invention, preferably, there is provided a phosphor which receives light emitted from the low-energy-band-gap layer and emits light having a wavelength longer than that of the light emitted from the low-energy-band-gap layer.

When such a phosphor is provided, the amount of unwanted light of relatively short wavelength (e.g., UV light) which is emitted from the light-emitting element can be reduced, and the short-wavelength light can be converted to light of relatively long wavelength. Therefore, provision of the phosphor is effective particularly when light of a desired color is to be obtained through conversion of light by means of the phosphor.

Provision of the phosphor is also effective when a color of emitted light which has been converted by means of the phosphor is to be mixed with emitted light of other colors. According to the seventh means, a color of light emitted from the light-emitting element can be corrected.

In eighth means of the present invention, preferably, there is provided an impurity-added semiconductor layer which receives light emitted from the low-energy-band-gap layer and emits light having a wavelength longer than that of the light emitted from the low-energy-band-gap layer.

When such an impurity-added semiconductor layer is provided, the amount of unwanted light of relatively short wavelength (e.g., UV light) which is emitted from the light-emitting element can be reduced, and the short-wavelength light can be converted to light of relatively long wavelength. Therefore, provision of the impurity-added semiconductor layer is effective particularly when light of a desired color is to be obtained through conversion of light by means of the semiconductor layer.

Provision of the impurity-added semiconductor layer is also effective, when emitted light of a color which has been converted by means of the semiconductor layer is to be mixed with emitted light of other colors. According to the eighth means, a color of light emitted from the light-emitting element can be corrected.

The means employing an impurity-added semiconductor layer may be combined with the aforementioned means employing a phosphor. In some cases, this combination enables sufficient correction of a color of light emitted from the light-emitting element. However, in the case where light which has been converted by means of an impurity-added semiconductor layer has a high luminance, even when the eighth means is carried out singly, sufficient effect may be obtained.

In ninth means of the present invention, preferably, at least one element selected from among silicon (Si), sulfur (S), selenium (Se), tellurium (Te), and germanium (Ge), serving as an impurity, is added to the aforementioned impurity-added semiconductor layer. These impurities effectively convert light of relatively short wavelength, such as UV light, to visible light. Through addition of such an impurity, emission efficiency of the light-emitting element can be improved.

For example, when a semiconductor layer (e.g., a GaN layer) containing an appropriate amount of such an n-type impurity is irradiated with UV light, visible light is obtained through photoluminescence. Therefore, the ninth means is particularly effective when UV light is to be converted to visible light.

When an impurity-added semiconductor layer which receives UV light and emits yellow light is added to a semiconductor light-emitting element containing a low-energy-band-gap layer which emits UV light and a low-energy-band-gap layer which emits blue light, the resultant semiconductor light-emitting element emits white light.

In tenth means of the present invention, preferably, the aforementioned impurity-added semiconductor layer serves as an n-type semiconductor layer, an n-type contact layer, or a high-carrier-concentration $n^+$ layer, and electrode formation or electrode connection is carried out through a flip chip process such that light is extracted through a substrate.

In the above case, emitted UV light passes through the aforementioned impurity-added semiconductor layer, and thus the amount of UV light which is converted to visible light increases as compared with the case of a wire-bonding-type light-emitting element.

Therefore, according to the tenth means, the color of emitted light can be corrected more effectively through conversion of the wavelength of the light.

When a low-energy-band-gap layer which emits red light is irradiated with photons of blue light, in some cases, electrons are excited in a light-emitting mechanism (band gap) of the low-energy-band-gap layer, and the excited electrons contribute to emission of red light in the mechanism. Through this effect, a portion of blue light is converted to red light. The greater the amount of light of short wavelength applied to a low-energy-band-gap layer which emits light of long wavelength, the greater the amount of light of short wavelength converted to light of long wavelength. That is, the greater the amount of light of short wavelength applied to the aforementioned impurity-added semiconductor layer, the greater the amount of light of short wavelength converted to light of long wavelength. The amount of light of short wavelength applied to a low-energy-band-gap layer which emits light of long wavelength greatly depends on the order of lamination of light-emitting semiconductor layers.

Since the order of lamination of light-emitting semiconductor layers is employed as a parameter for optimization of the color of light emitted from the light-emitting element or emission efficiency, when the lamination order is optimally or suitably regulated, the color of light emitted from the element can be easily converted to white.

In eleventh means, preferably, light-emitting semiconductor layers are laminated such that a semiconductor layer which emits light of a shorter wavelength is provided closer to a light extraction side of the light-emitting element. The term "light-emitting semiconductor layer" refers to the aforementioned low-energy-band-gap layer which emits light spontaneously. However, the term "light-emitting semiconductor layer" encompasses a semiconductor layer which emits light secondarily, inductively, or indirectly, through conversion of UV light of relatively short wavelength to visible light of long wavelength by means of, for example, photoluminescence. That is, the term "light-emitting semiconductor layer" encompasses the aforementioned impurity-added semiconductor layer.

According to the eleventh means, the amount of light of short wavelength converted to light of long wavelength can be reduced, and extraction efficiency of emitted light can be enhanced.

Therefore, unintended change of color of light emitted from the light-emitting element, which is attributed to conversion of the wavelength of the light, is easily avoided. According to the eleventh means, the effect of such conversion (i.e., secondary effect) on the color of light emitted from the light-emitting element is not necessarily a strong consideration, and the light-emitting element can be designed with relative ease. In addition, chromaticity of light emitted from the element can be regulated easily.

When the intensity of visible light of short wavelength (e.g., blue light) emitted from a low-energy-band-gap layer is relatively low, the eleventh means is effectively employed for maintaining the intensity at a certain level. However, the terms "short wavelength" and "long wavelength" are used merely on a relative basis.

According to the first through eleventh means, the aforementioned object of the present invention can be effectively attained.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

The present invention will now be described with reference to preferred embodiments; however, the present invention is not limited to the embodiments.

The present invention will next be described in detail with reference to embodiments, which should not be construed as limiting the invention thereto.

Figure 4:
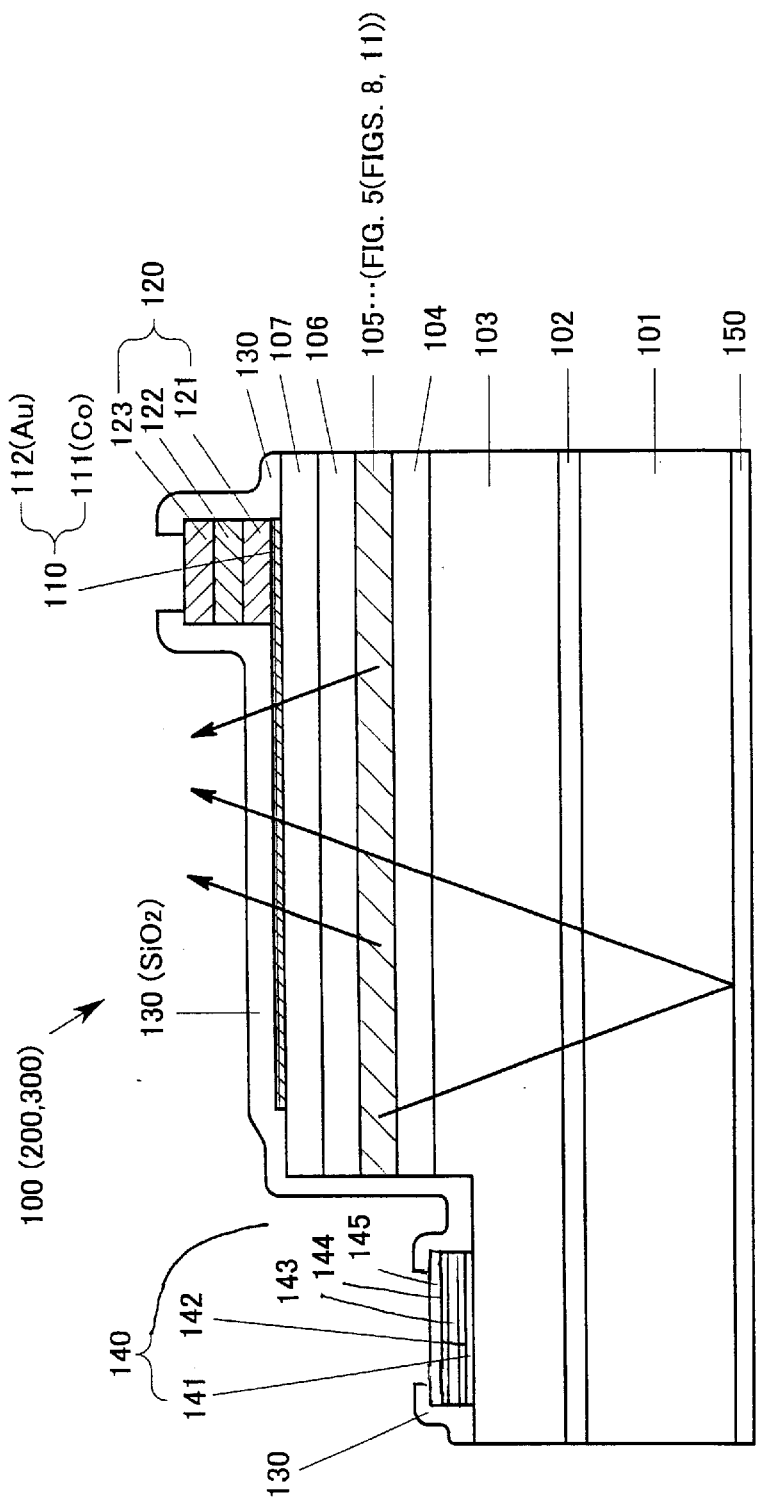
FIG. 4 is a schematic cross-sectional view showing a common structure of semiconductor light-emitting elements 100, 200, and 300, which are drawn to a first embodiment, a second embodiment, and a third embodiment of the present invention, respectively.

FIG. 4 is a schematic representation showing a common structure of semiconductor light-emitting elements 100, 200, and 300, which serve as a first embodiment, a second embodiment, and a third embodiment, respectively. These semiconductor light-emitting elements 100, 200, and 300 have a common structure as shown in FIG. 4, except for the structure of a multiple layer 105 containing light-emitting layers (see FIGS. 5, 8, and 11).

First Embodiment

As shown in FIG. 4, a semiconductor light-emitting element 100 of the first embodiment includes a sapphire substrate 101 (thickness: about 300 μm); a buffer layer 102 containing aluminum nitride (AlN) (thickness: about 10 nm) formed on the substrate 101; and an n-type contact layer 103 (high-carrier-concentration n$^+$ layer) containing silicon (Si)-doped GaN (thickness: about 4 μm) formed on the buffer layer 102.

An n-type semiconductor layer 104 containing Si-doped $Al_{0.3}Ga_{0.7}N$ (thickness: about 100 nm) is formed on the n-type contact layer 103. On the n-type semiconductor layer 104 is formed a multiple layer 105 containing light-emitting layers, the layer 105 being the most important characteristic feature of the first embodiment.

The internal structure of the multiple layer 105 is described in detail below with reference to FIG. 5.

A p-type semiconductor layer 106 containing Mg-doped ptype $Al_{0.2}Ga_{0.8}N$ (thickness: about 30 nm) is formed on the multiple layer 105, and a p-type contact layer 107 containing Mg-doped p-type $Al_{0.06}Ga_{0.94}N$ (thickness: about 70 nm) is formed on the p-type semiconductor layer 106.

A light-transmittable thin positive electrode 110 is formed on the p-type contact layer 107 through metal deposition, and a negative electrode 140 is formed on the n-type contact layer 103. The light-transmittable thin positive electrode 110 includes a first thin positive electrode layer 111 containing cobalt (Co) (thickness: about 15 Å) which is connected directly to the p-type contact layer 107; and a second thin positive electrode layer 112 containing gold (Au) (thickness: about 60 Å) which is connected to the first thin positive electrode layer 111 containing cobalt.

A thick positive electrode 120 includes a first thick positive electrode layer 121 containing vanadium (V) (thickness: about 175 Å); a second thick positive electrode layer 122 containing gold (Au) (thickness: about 15,000 Å); and a third thick positive electrode layer 123 containing aluminum (Al) (thickness: about 100 Å), the layers 121 through 123 being successively formed on the light-transmittable thin positive electrode 110.

The negative electrode 140 of multi-layer structure includes a vanadium (V) layer 141 (thickness: about 175 Å); an aluminum (Al) layer 142 (thickness: about 1,000 Å); a vanadium (V) layer 143 (thickness: about 500 Å); a nickel (Ni) layer 144 (thickness: about 5,000 Å); and a gold (Au) layer 145 (thickness: 8,000 Å), the layers 141 through 145 being successively formed on an exposed portion of the n-type contact layer 103.

A protective film 130 containing $SiO_2$ is formed on the top of the light-emitting element.

A reflective metallic layer 150 containing aluminum (Al) (thickness: about 5,000 Å) is formed on the bottom surface of the sapphire substrate 101 through metal deposition. The reflective metallic layer 150 may be formed from a metal such as Rh, Ti, or W; or a nitride such as TiN or HfN.

The internal structure of the multiple layer 105 containing light-emitting layers, which is the most important characteristic feature of the first embodiment, will next be described in detail with reference to FIG. 5.

Figure 5:
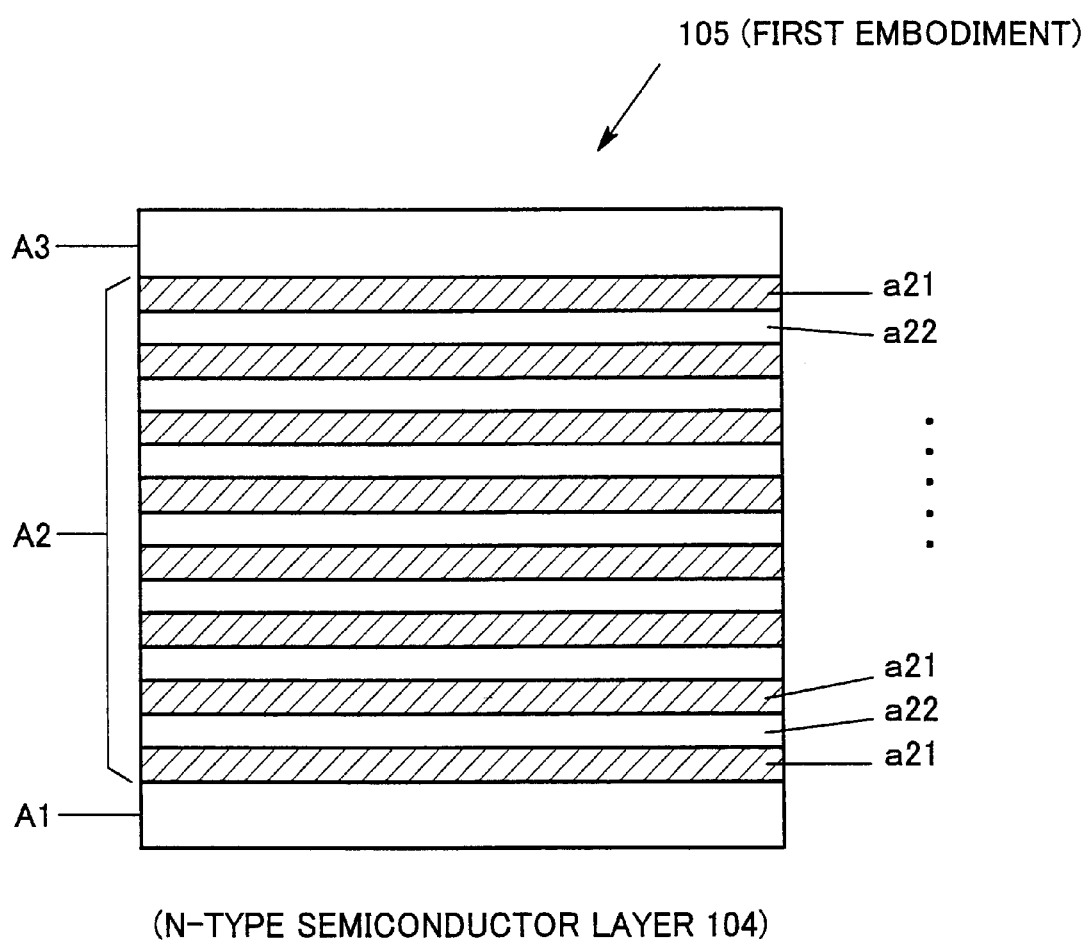
FIG. 5 shows a schematic cross-sectional view of a light-emitting-layers-containing multiple layer 105 of the semiconductor light-emitting element 100 of the first embodiment.

FIG. 5 shows a schematic cross-sectional view of the light-emitting-layers-containing multiple layer 105 of the semiconductor light-emitting element 100 of the first embodiment.

A first low-energy-band-gap layer A1 containing $In_{0.17}Ga_{0.83}N$ (thickness: about 4 nm), which emits blue light and has an SQW structure, is laminated on the n-type semiconductor layer 104. A multiple quantum barrier-well layer A2 laminated on the first low-energy-band-gap layer A1 includes 15 semiconductor layers. Specifically, the multiple quantum barrier-well layer A2 includes quantum-barrier-formation barrier layers a21 formed from $Al_{0.06}Ga_{0.7}N$ (thickness of each layer: about 2.5 nm) and quantum-barrier-formation well layers a22 formed from $Al_{0.06}In_{0.01}Ga_{0.93}N$ (thickness of each layer: about 2.5 nm), the layers a21 and a22 being laminated alternately (number of lamination cycles: 7.5).

On the multiple quantum barrier-well layer A2 is laminated a second low-energy-band-gap layer A3 containing $Al_{0.06}In_{0.01}Ga_{0.93}N$ (thickness: about 4 nm), which emits UV light and has an SQW structure.

Figure 1A:
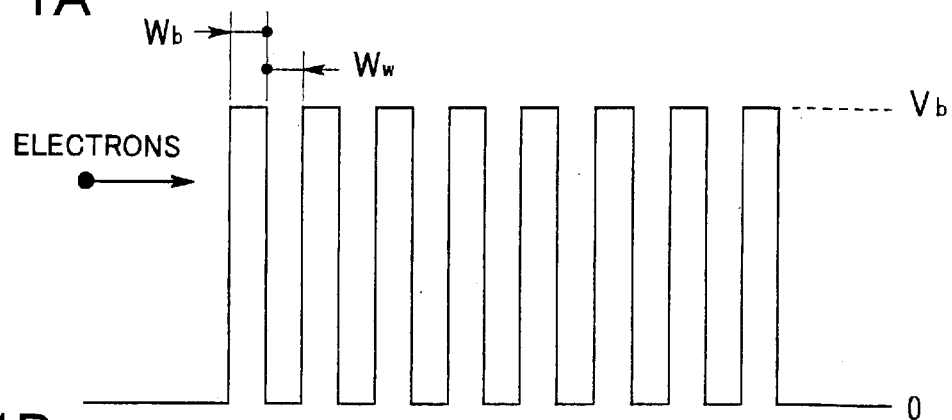
FIGS. 1A–1C illustrate the function of a multiple quantum barrier-well layer employed in the present invention.
Figure 1B:
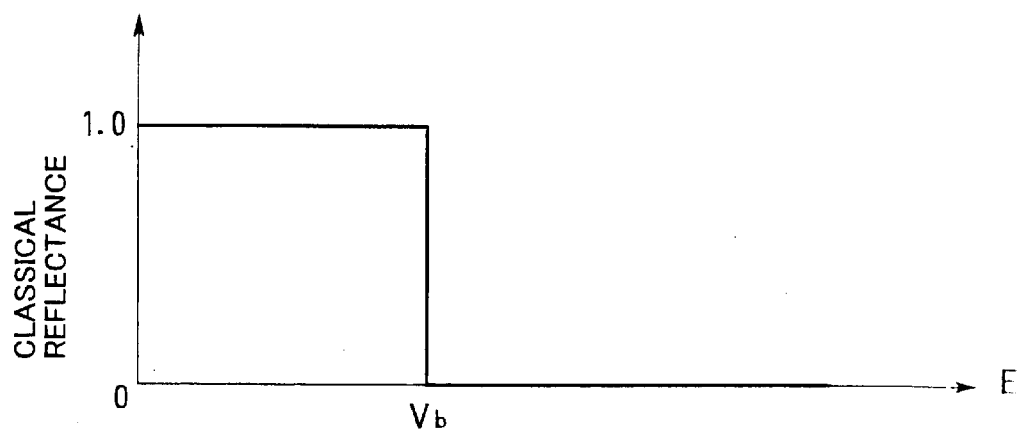
Figure 1C:
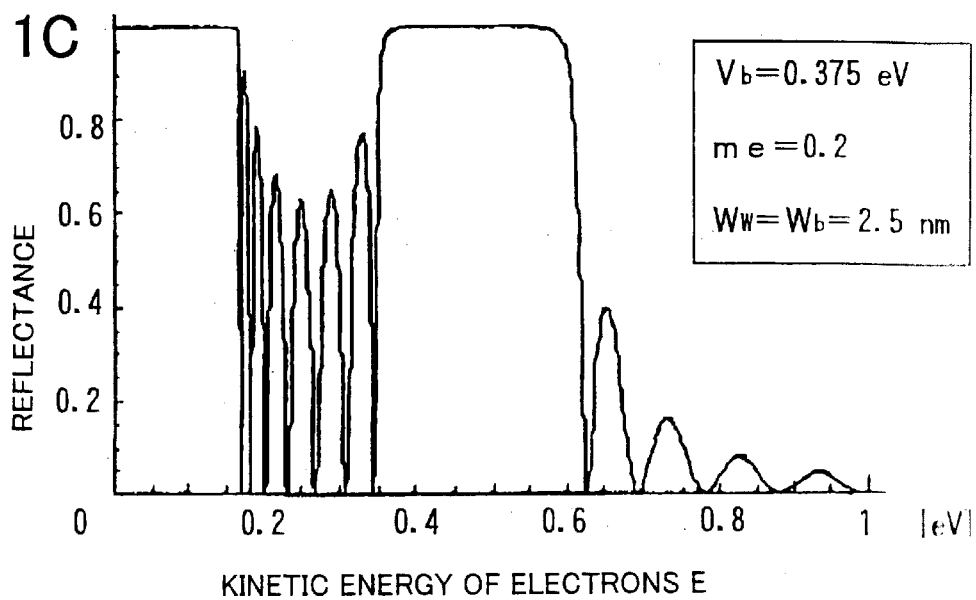
Figure 2:
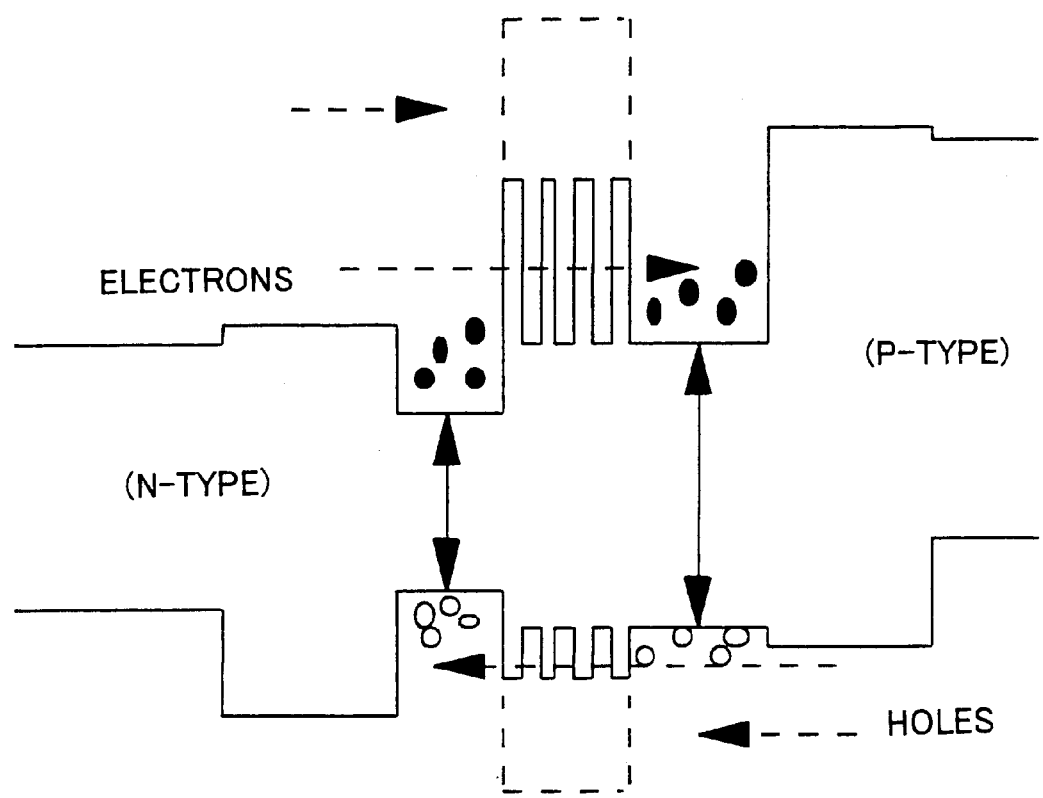
FIG. 2 is an energy band diagram illustrating the effect of the multiple quantum barrier-well layer of the semiconductor light-emitting element of the present invention.

As is clear from the effects of the present invention described above with reference to FIGS. 1 through 3, the transmittance of carriers which pass through the multiple quantum barrier-well layer A2 is about ½ when a voltage of 3V is applied to the light-emitting element 100. In this case, forward current is about 20 mA.

Figure 6:
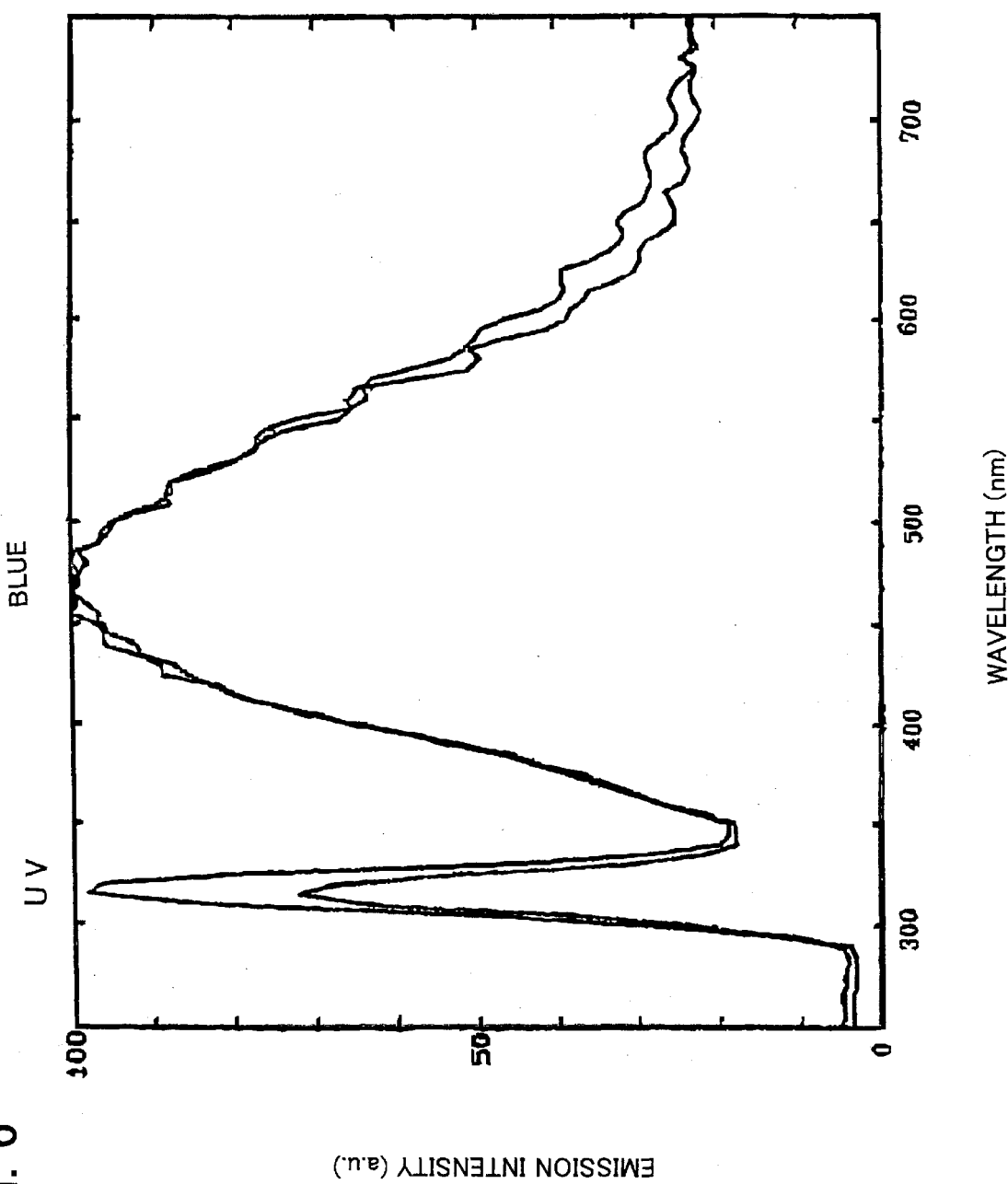
FIG. 6 shows an emission spectrum of the semiconductor light-emitting element 100 of the first embodiment.

FIG. 6 shows an emission spectrum of the semiconductor light-emitting element under application of a voltage of 3V. As is clear from FIG. 6, the light-emitting element 100 having the aforementioned structure exhibits emission peaks in a UV light region (at about 320 nm) and in a blue light region (at about 470 nm). As is also clear from FIG. 6, the intensity of emission at about 320 nm is substantially the same as that of emission at about 470 nm.

The first low-energy-band-gap layer A1 and the second low-energy-band-gap layer A3 may be exchanged with each other.

Figure 7:
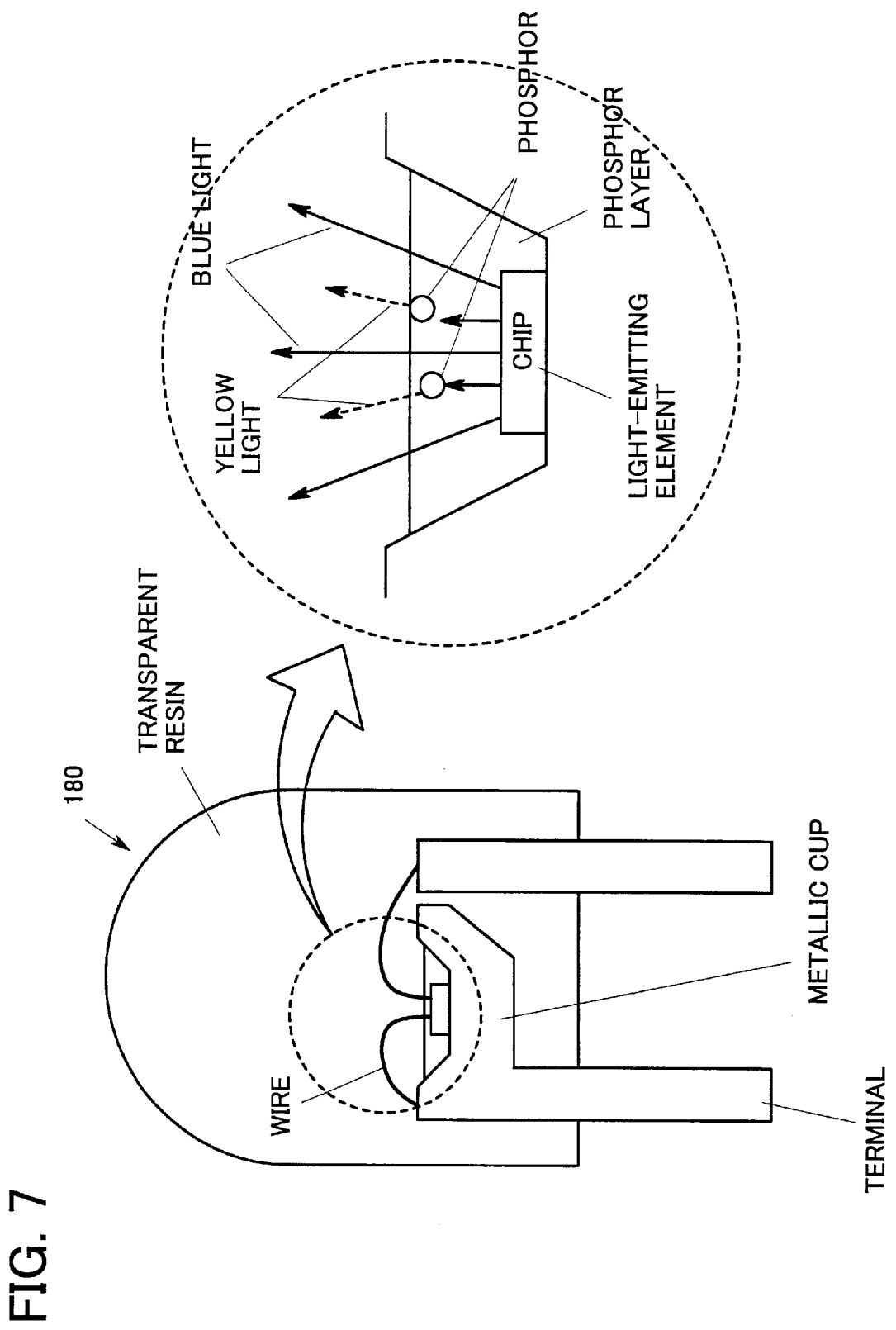
FIG. 7 shows the structure of an LED 180 including the semiconductor light-emitting element 100 of the first embodiment.

FIG. 7 shows the structure of an LED 180 including the semiconductor light-emitting element 100. The LED 180 includes a phosphor which converts UV light to yellow light, and the phosphor is provided around the light-emitting element 100 placed in a metallic cup. The chromaticity of light emitted from the LED can be varied by regulating the compositional proportions or the amount of a phosphor to be employed. Moreover, different phosphors may be employed in combination.

In the LED 180, yellow light (about 560 to 580 nm)—which is obtained indirectly, through the effect of the phosphor, from UV light emitted from the second low-energy-band-gap layer A3 of the semiconductor light-emitting element 100—is mixed with blue light (about 380 to 520 nm) obtained directly from the first low-energy-band-gap layer A1 of the element 100, to thereby obtain white light.

The color of emitted light and emission intensity may be regulated through the following means (M1) to (M7).

(M1): The intensity of blue light emitted from the first low-energy-band-gap layer A1 is varied.

(M2): The intensity of UV light emitted from the second low-energy-band-gap layer A3 is varied.

In the means (M1) or (M2), the intensity of light emitted from the low-energy-band-gap layer may be varied by regulating the thickness and the number of the layer. An MQW structure may be incorporated into the low-energy-band-gap layer.

(M3): The transmittance of carriers which pass through the multiple quantum barrier-well layer A2 is regulated.

The transmittance of carriers may be regulated by varying, for example, the thickness of the quantum-barrier-formation barrier layers a21, the lamination cycle of the layers, the number of layers, or the compositional proportions of the layers.

(M4): The order of lamination of the first and second low-energy-band-gap layers A1 and A3 is optimized.

When the intensity of yellow light (or UV light) is lower than that of blue light, preferably, the second low-energy-band-gap layer A3 which emits UV light is provided close to the light extraction side of the semiconductor light-emitting element 100 as described above.

(M5): A phosphor to be employed is regulated in terms of compositional proportions or amount.

(M6): An n-type impurity-added semiconductor layer which exerts a photoluminescence effect similar to that of a phosphor is provided.

(M7): Operation voltage, operation temperature, etc. are varied.

When operation voltage or operation temperature is varied, since distribution of the kinetic energy of carriers can be controlled, the transmittance of the carriers which pass through the multiple quantum barrier-well layer A2 can be regulated.

However, in general, the thickness of a quantum-barrier-formation well layer or a quantum-barrier-formation barrier layer constituting a multiple quantum barrier-well layer varies in accordance with operation temperature. Therefore, when the means (M7) is carried out, some attention must be paid to the effect of variation in the thickness of the layer on the transmittance of carriers which passes through the multiple quantum barrier-well layer.

Second Embodiment

In a light-emitting element 200 of a second embodiment, the light-emitting-layers-containing multiple layer 105 is improved such that the element 200 can emit light of red color, which is not obtained from the single-chip-type white LED including the light-emitting element 100 of the first embodiment.

Figure 8:
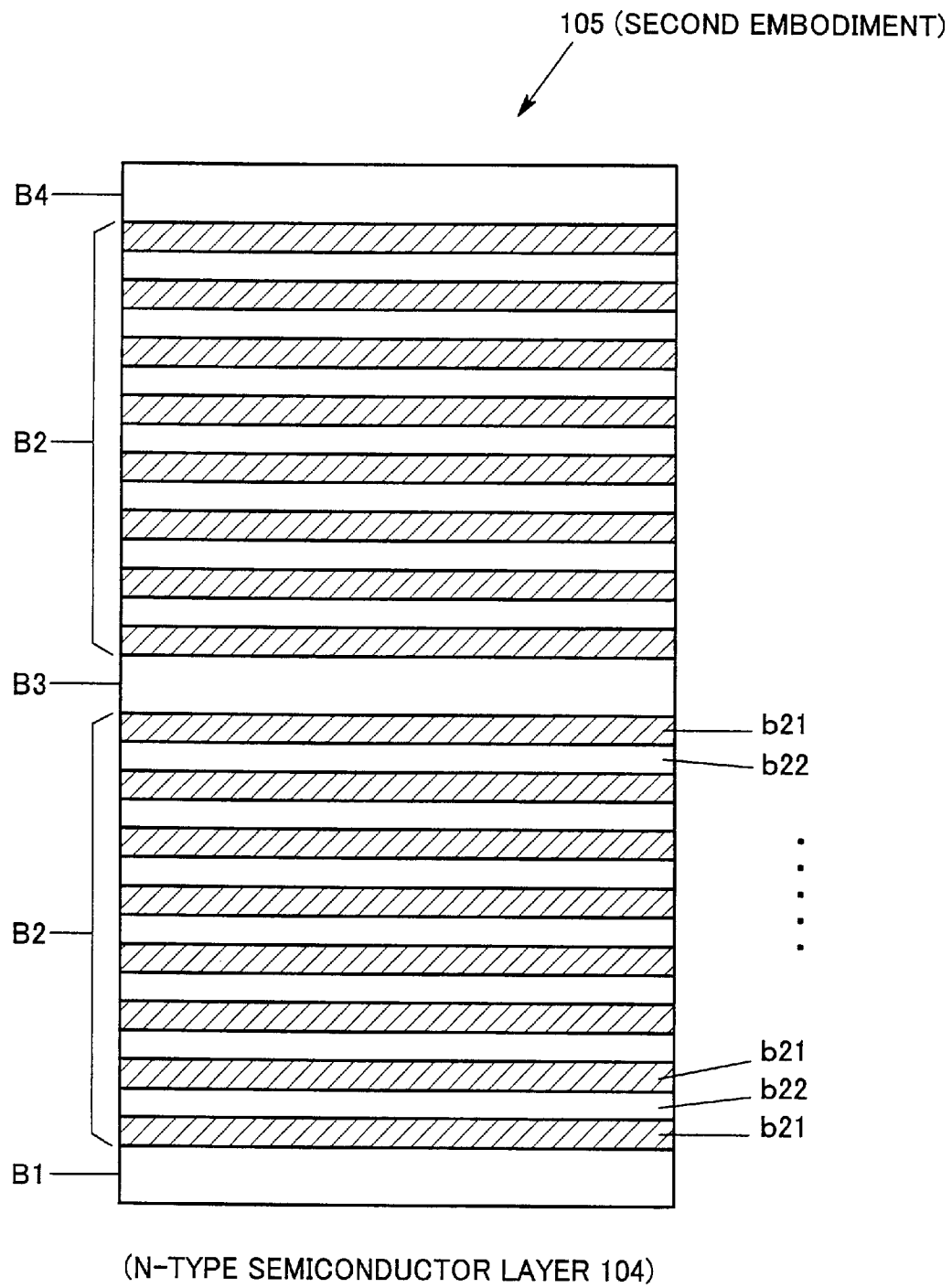
FIG. 8 shows a schematic cross-sectional view of a light-emitting-layers-containing multiple layer 105 of the semiconductor light-emitting element 200 of the second embodiment.

FIG. 8 shows a schematic cross-sectional view of the light-emitting-layers-containing multiple layer 105 of the semiconductor light-emitting element 200 of the second embodiment.

A first low-energy-band-gap layer B1 containing $In_{0.82}Ga_{0.18}N$ (thickness: about 4 nm), which emits red light and has an SQW structure, is laminated on the n-type semiconductor layer 104 shown in FIG. 4. A multiple quantum barrier-well layer B2 laminated on the first low-energy-band-gap layer B1 includes 15 semiconductor layers. Specifically, the multiple quantum barrier-well layer B2 includes quantum-barrier-formation barrier layers b21 formed from $Al_{0.01}In_{0.02}Ga_{0.88}N$ (thickness of each layer: about 2.5 nm) and quantum-barrier-formation well layers b22 formed from $Al_{0.02}In_{0.01}Ga_{0.97}N$ (thickness of each layer: about 2.5 nm), the layers b21 and b22 being laminated alternately (number of lamination cycles: 7.5).

On the multiple quantum barrier-well layer B2 is laminated a second low-energy-band-gap layer B3 containing $In_{0.38}Ga_{0.62}N$ (thickness: about 4 nm), which emits green light and has an SQW structure.

On the second low-energy-band-gap layer B3 is laminated a multiple quantum barrier-well layer B2 having the same structure as described above. On the multiple quantum barrier-well layer B2 is laminated a third low-energy-band-gap layer B4 containing $In_{0.17}Ga_{0.83}N$ (thickness: about 4 nm), which emits blue light and has an SQW structure.

Figure 3:
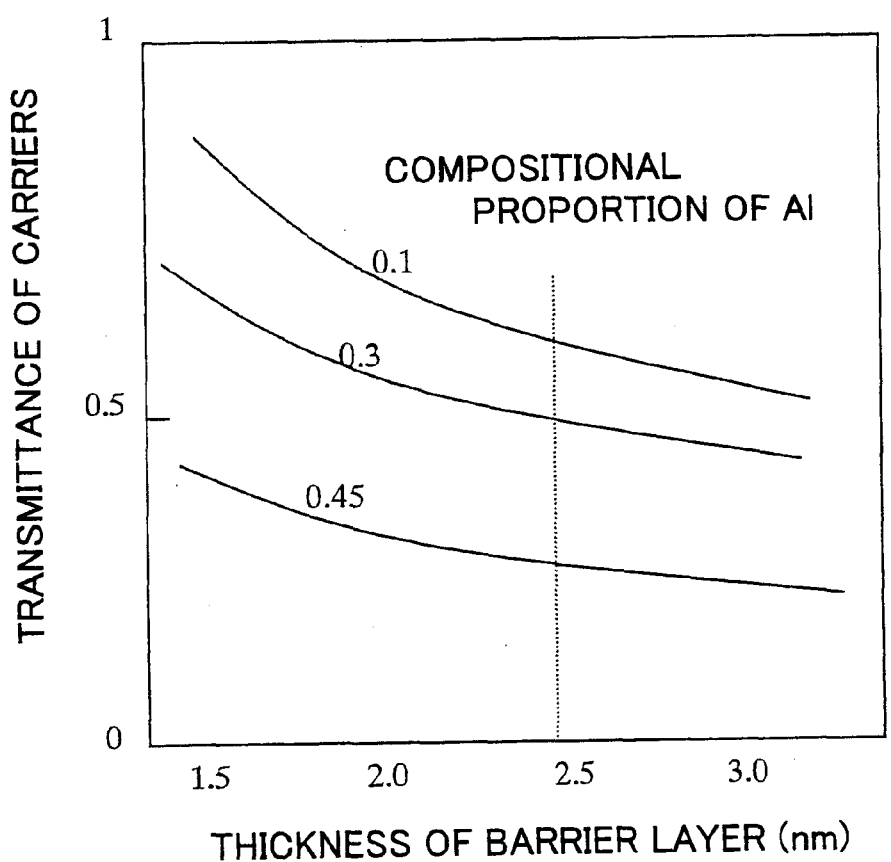
FIG. 3 is a graph showing criteria for forming a suitable or optimal multiple quantum barrier-well layer.

The transmittance of carriers which pass through the multiple quantum barrier-well layer B2 is found to be 0.6, through calculation on the basis of the graph shown in FIG. 3 employing the thickness of the quantum-barrier-formation barrier layer b21 and the Al content of the layer b21.

In this case, proportions of conduction electrons distributed to the first low-energy-band-gap layer B1, the second low-energy-band-gap layer B3, and the third low-energy-band-gap layer B4 are found to be 0.40:0.24:0.36, through calculation on the basis of merely the effect of the light-emitting-layers-containing multiple layer 105 of the second embodiment shown in FIG. 8, while neglecting a secondary transmission phenomenon (i.e., delayed reflection) of carriers which have been reflected from the p-type semiconductor layer 106, the n-type semiconductor layer 104, or the multiple quantum barrier-well layer B2, and neglecting the difference in kinetic energy between carriers which have passed through the layer B2 and carriers which have not passed through the layer B2.

On the basis of calculation in a manner similar to the case of the conduction electrons, proportions of holes distributed to the first low-energy-band-gap layer B1, the second lowenergy-band-gap layer B3, and the third low-energy-band-gap layer B4 are found to be 0.36:0.24:0.40. Therefore, on the basis of the above-obtained proportions of carrier distribution, proportions in emission intensity between the low-energy-band-gap layers B1, B3, and B4 are roughly calculated to become 0.36:0.24:0.36; i.e., 3:2:3.

Figure 9:
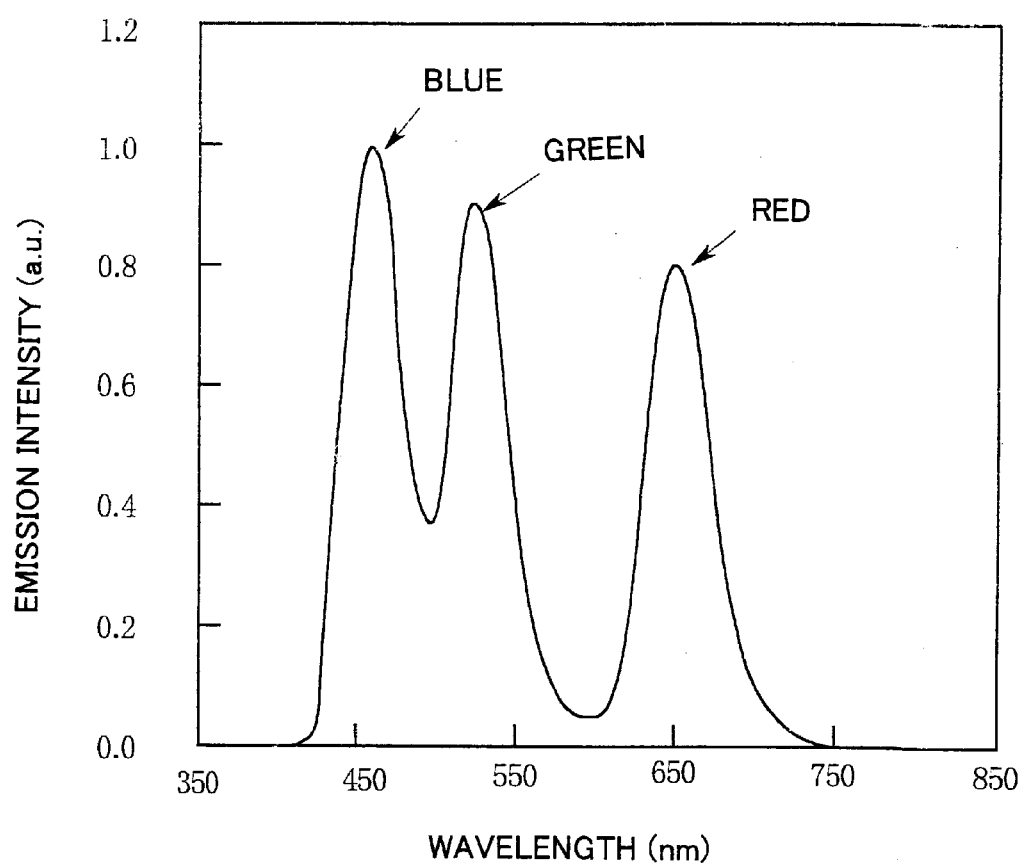
FIG. 9 shows an emission spectrum of the semiconductor light-emitting element 200 of the second embodiment.

FIG. 9 shows an emission spectrum of the semiconductor light-emitting element 200 of the second embodiment as measured under the following conditions: applied voltage: 3V, forward current: 20 mA. As is clear from FIG. 9, the light-emitting element 200 exhibits a sharp emission peak at about 650 nm corresponding to red light emitted from the first low-energy-band-gap layer B1, a sharp emission peak at about 520 nm corresponding to green light emitted from the second low-energy-band-gap layer B3, and a sharp emission peak at about 460 nm corresponding to blue light emitted from the third low-energy-band-gap layer B4.

When the transmittance of carriers which pass through the multiple quantum barrier-well layer B2 is 0.6, as described above, the amount of carriers distributed to the second low-energy-band-gap layer B3 is calculated to be lower than that of carriers distributed to the first or third low-energy-band-gap layer B1 or B4. However, the intensity of green light emitted from the second low-energy-band-gap layer B3 is comparable to that of light emitted from the first or third low-energy-band-gap layer B1 or B4. The reason for the above may be attributed to high emission efficiency of the low-energy-band-gap layer which emits green light. However, the aforementioned proportions in carrier distribution are difficult to obtain accurately, and thus the quantitative relation between the carrier distribution and the emission intensity has not yet been elucidated.

The reason why the intensity of green light emitted from the second low-energy-band-gap layer B3 is comparable to that of light emitted from the first or third low-energy-band-gap layer B1 or B4 may be explained as follows: some carriers reflected from the p-type and n-type semiconductor layers 106 and 104 pass through the multiple quantum barrier-well layers B2 again, and migrate to the second low-energy-band-gap layer B3.

Moreover, the reason why the intensity of green light emitted from the second low-energy-band-gap layer B3 is comparable to that of light emitted from the first or third low-energy-band-gap layer B1 or B4 may be explained as follows: stress applied to the layer B3 from the substrate 101, the positive electrodes 110 and 120, and the protective film 130 are reduced by virtue of the strain reducing effect of the multiple quantum barrier-well layers B2; consequently, the second low-energy-band-gap layer B3 maintains a relatively high level of crystallinity.

Figure 10:
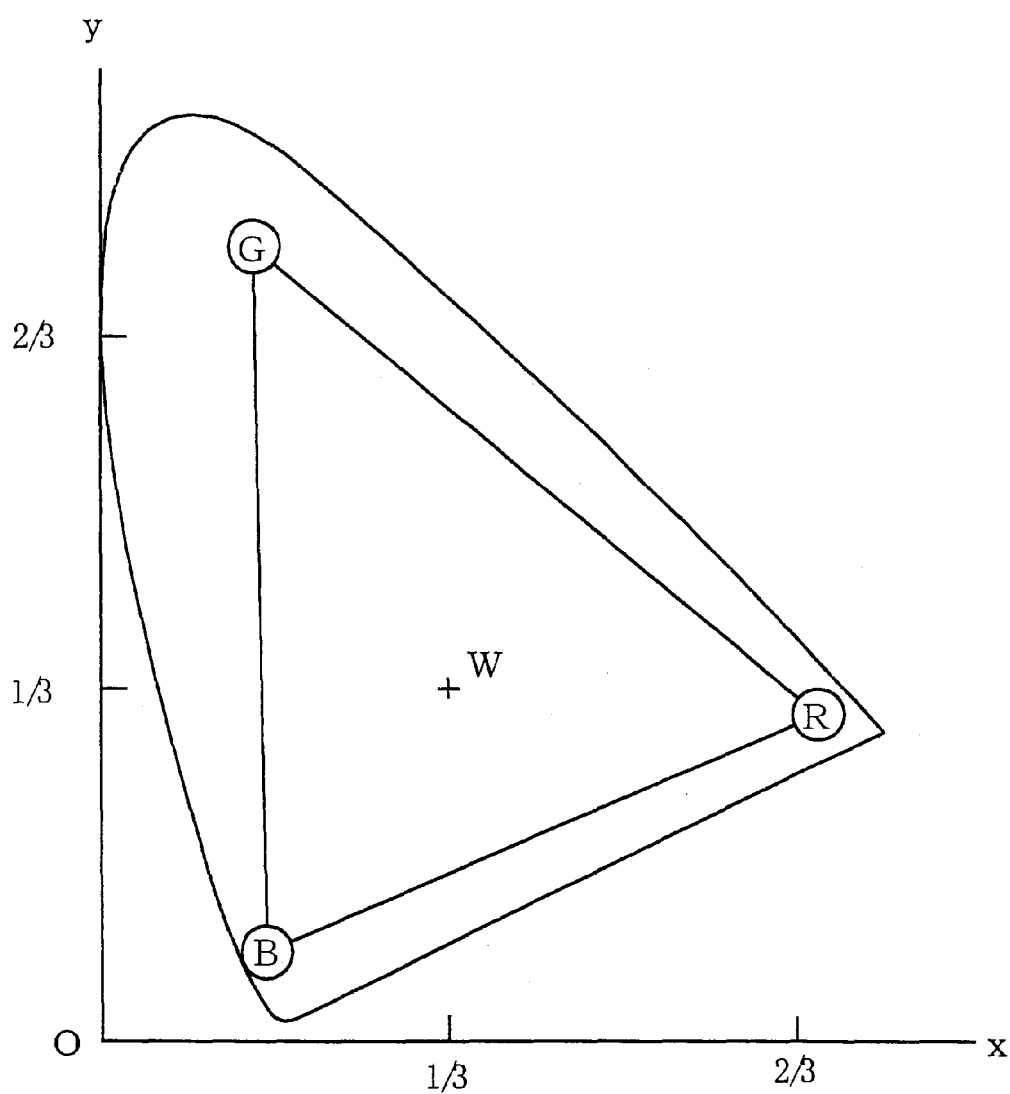
FIG. 10 is a chromaticity diagram showing the color reproduction profile of an object which has been illuminated with the semiconductor light-emitting element 200 of the second embodiment.

FIG. 10 is a chromaticity diagram showing the color reproduction profile of an object which has been illuminated by the semiconductor light-emitting element 200 of the second embodiment. In FIG. 10, reference letters R, G, and B represent chromaticities in the vicinity of the respective peaks of the aforementioned red light, green light, and blue light.

In the semiconductor light-emitting element 200, when carriers are appropriately distributed to the first, second and third low-energy-band-gap layers B1, B3, and B4, mean coordinates (x, y) of the chromaticity diagram in terms of lightness substantially correspond to the coordinates of a white point W ($1/3$, $1/3$).

The semiconductor light-emitting element 200 enables production of a full-color single-chip-type white LED which can reproduce a wide range of color. When the semiconductor light-emitting element 200 is employed in an illumination apparatus, an arbitrary color within the profile formed by connecting points R, G, and B shown in FIG. 10 can be reproduced by the illumination apparatus.

When the low-energy-band-gap layer which emits light of a shorter wavelength is provided closer to a light extraction side as in the case of the light-emitting element 200, since light emitted from all the low-energy-band-gap layers is not absorbed by the low-energy-band-gap layer provided close to the light extraction side, extraction efficiency of emitted light can be enhanced, and chromaticity of the emitted light can be easily regulated.

As shown in the chromaticity diagram of FIG. 10, when a triangular color production profile is formed by chromaticities corresponding to low-energy-band-gap layers which emit red light, green light, and blue light, a wide range of color can be reproduced. The blue-light-emitting low-energy-band-gap layer may emit violet light (380 to 455 nm); i.e., light having a wavelength shorter than that of blue light (455 to 485 nm).

The light-emitting element of the second embodiment may include, in addition to the low-energy-band-gap layers which emit red light, green light, and blue light, a low-energy-band-gap layers which emits yellow light or blue-green light. Thus, when the number of low-energy-band-gap layers which emit light of different wavelengths is increased, a tetragonal or pentagonal color production profile can be formed in the chromaticity diagram shown in FIG. 10. Therefore, the resultant light-emitting element enables production of a full-color single-chip white LED which can reproduce a wider range of color.

In the case where such a polygonal color production profile is formed in the chromaticity diagram, when mean coordinates (x, y) in terms of lightness corresponding to light emitted from the low-energy-band-gap layers are regulated in the chromaticity diagram such that the mean coordinates substantially correspond to the coordinates of a white point W ($1/3$, $1/3$), there can be obtained a full-color single-chip white LED which can reproduce a wide range of color when employed in a white illumination apparatus.

In the first and second embodiments, lightness of emitted light of different wavelengths is regulated by varying the thicknesses of the low-energy-band-gap layers. However, lightness of emitted light of different wavelengths may be regulated by varying the number of the low-energy-band-gap layers.

The semiconductor light-emitting element 200 of the second embodiment emits substantially no UV light or infrared light. Therefore, the element 200 enables production of a full-color single-chip white LED which does not adversely affect the eyes, and which exhibits high energy efficiency as compared with a conventional white LED.

The aforementioned embodiments are drawn to a single-chip white LED of wire bonding type. However, the present invention may be applied to a single-chip white LED of arbitrary type (e.g., flip chip type).

When a light-emitting element of flip chip type is produced, the order of lamination of a plurality of low-energy-band-gap layers is reversed in relation to the case of the aforementioned embodiments. Therefore, when the flip-chip-type light-emitting element is produced, like the case of the aforementioned embodiments, a low-energy-band-gap layer which emits light of a shorter wavelength is provided closer to a light extraction side of the light-emitting element. As a result, light emitted from all the low-energy-band-gap layers is not absorbed by the low-energy-band-gap layer provided close to the light extraction side. Therefore, the resultant light-emitting element enables production of a full-color single-chip white LED which exhibits high light extraction efficiency and which can reproduce a wide range of color.

In the case of production of a light-emitting element of flip chip type, the reflective metallic layer 150 is not required, and a non-light-transmittable thick electrode (thickness: about 2,000 Å) formed from a metal exhibiting excellent light reflectance, such as rhodium (Rh), is provided instead of the light-transmittable thin positive electrode 110. In this case, the thick positive electrode 120 is not required.

Similar to the case of the light-emitting element 100, in the semiconductor light-emitting element 200, the intensity of light emitted from the low-energy-band-gap layers may be regulated through the aforementioned means (M1) to (M7).

Third Embodiment

Figure 11:
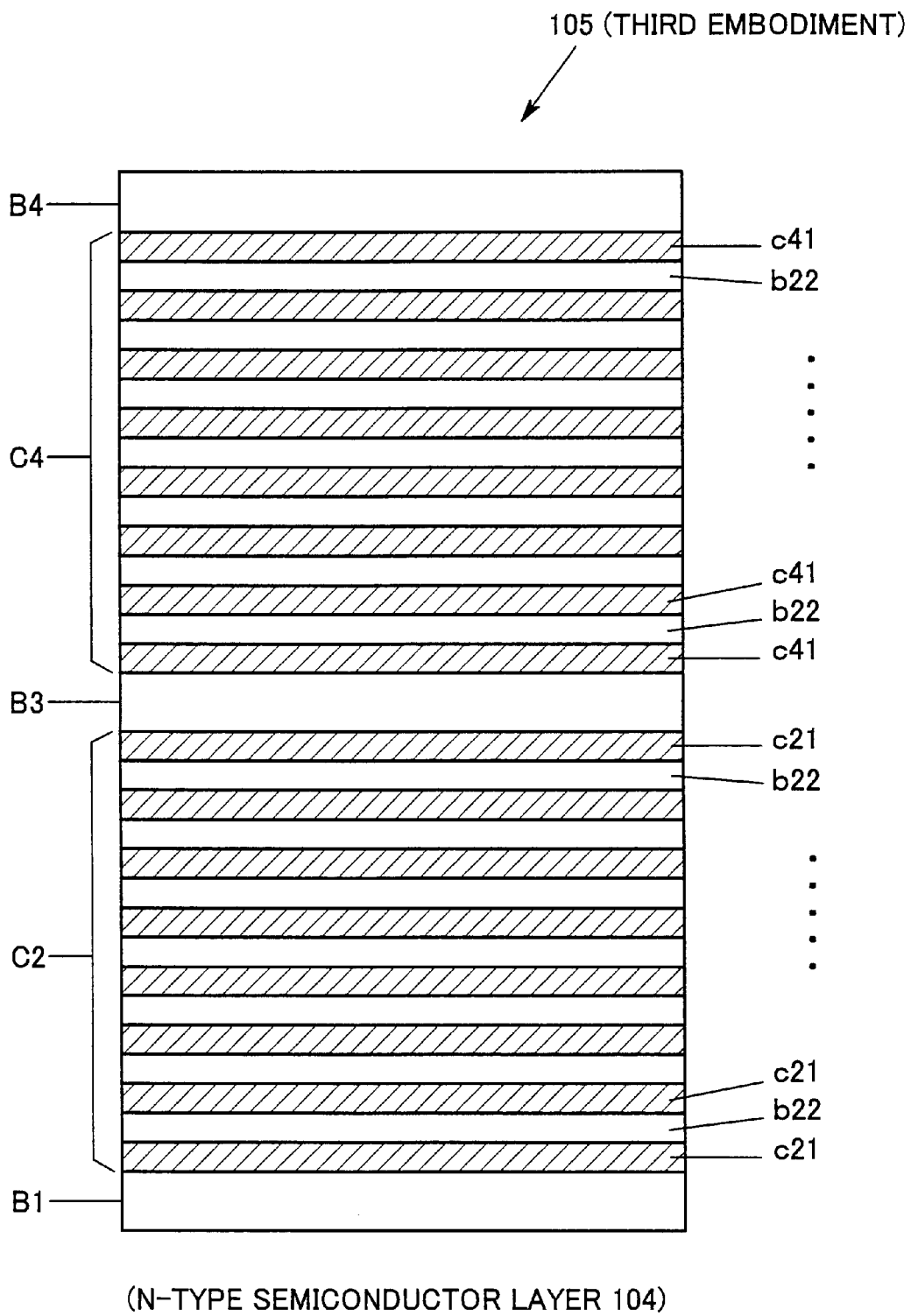
FIG. 11 shows a schematic cross-sectional view of a light-emitting-layers-containing multiple layer 105 of the semiconductor light-emitting element 300 of the third embodiment.

FIG. 11 shows a schematic cross-sectional view of the light-emitting-layers-containing multiple layer 105 of a semiconductor light-emitting element 300 of a third embodiment. The internal structure of the multiple layer 105 of the light-emitting element 300 is substantially the same as that of the multiple layer 105 of the semiconductor light-emitting element 200 of the second embodiment, except for the compositional proportions of quantum-barrier-formation barrier layers constituting a multiple quantum barrier-well layer; the proportions slightly differing between the light-emitting elements of the second and the third embodiments.

Specifically, as shown in FIG. 11, eight quantum-barrier-formation barrier layers c21 (thickness of each layer: about 2.5 nm) constituting a first multiple quantum barrier-well layer C2 of the light-emitting element 300 are formed from $Al_{0.60}Ga_{0.40}N$. Eight quantum-barrier-formation barrier layers c41 (thickness of each layer: about 2.5 nm) constituting a second multiple quantum barrier-well layer C4 are formed from $Al_{0.40}Ga_{0.60}N$. Although the compositional proportions of the quantum-barrier-formation barrier layers c21 and c41 slightly differ from those of the quantum-barrier-formation barrier layers b21 constituting the multiple quantum barrier-well layer B2 of the semiconductor light-emitting element 200, the structure of the multiple layer 105 of the element 300 is the same as that of the light-emitting-layers-containing multiple layer 105 of the element 200.

When the proportion of aluminum contained in the quantum-barrier-formation barrier layers constituting the multiple quantum barrier-well layer C2 or C4 is relatively increased, as is clear from FIG. 3, the transmittance of carriers which pass through the multiple quantum barrier-well layer C2 or C4 becomes half or less the transmittance of carriers which pass through the multiple quantum barrier-well layer B2 of the light-emitting element 200; i.e., about 0.60.

When an operation voltage of about 3 V is applied to the light-emitting element 300 having the aforementioned structure, the proportions of conduction electrons distributed to the first low-energy-band-gap layer B1, the second low-energy-band-gap layer B3, and the third low-energy-band-gap layer B4 become high:medium:low, and the proportions of holes distributed to the layer B1, the layer B3, and the layer B4 become low:medium:high. Therefore, when an operation voltage of about 3 V is applied to the light-emitting element 300, the intensity of light emitted from the second low-energy-band-gap layer B3, in which conduction electrons and holes are distributed in a well-balanced manner, becomes the highest. As a result, the light-emitting element 300 emits green light.

When an operation voltage of about 5 V is applied to the light-emitting element 300, the kinetic energy of carriers injected to the multiple layer 105 is increased sufficiently, and the carriers selectively pass through the multiple quantum barrier-well layers by virtue of the aforementioned tunnel effect. Therefore, the transmittance of carriers which pass through the multiple quantum barrier-well layer C2 or C4 becomes substantially the same as that of carriers which pass through the multiple quantum barrier-well layer B2 of the light-emitting element 200. As a result, the light-emitting element 300 emits white light, like the case of the light-emitting element 200.

Under application of an operation voltage of about 5 V, since carriers are distributed to the low-energy-band-gap layers B1, B3, and B4 in ideal proportions, the light-emitting element 300 emits white light of high intensity at high emission efficiency.

When an operation voltage of about 7 V is applied to the light-emitting element 300, the kinetic energy level of carriers becomes substantially corresponds to "overflow prevention energy level" at which overflow of carriers is effectively prevented by virtue of the interference effect of the multiple quantum barrier-well layers. Therefore, since the reflectance of carriers to the multiple quantum barrier-well layers C2 and C4 becomes considerably high, the carriers encounter difficulty in passing through the barrier-well layers. Such tendency is observed to be considerable in holes injected to the multiple layer 105 from the p-type semiconductor layer 106. Therefore, the proportions of conduction electrons distributed to the first low-energy-band-gap layer B1, the second low-energy-band-gap layer B3, and the third low-energy-band-gap layer B4 become high:low:low, and the proportions of holes distributed to the layer B1, the layer B3, and the layer B4 become very low:low:high.

Therefore, when an operation voltage of about 7 V is applied to the light-emitting element 300, the intensity of light emitted from the third low-energy-band-gap layer B4 becomes the highest, and thus the element 300 emits blue light.

As described above, when operation voltage applied to the light-emitting element 300 of the third embodiment is increased from 3 V to 5 V and further to 7 V, the color of light emitted from the element 300 is changed from green to white to blue.

Since the color of light emitted from the light-emitting element 300 is varied in accordance with the proportions of carriers distributed to the low-energy-band-gap layers, when the order of lamination of the first, second, and third low-energy-band-gap layers B1, B3, and B4 is appropriately varied, a desired color of light is obtained from the element 300 under application of a specific operation voltage.

For example, in the case where the green-light-emitting low-energy-band-gap layer B3 is provided on the n-type semiconductor layer 104, the red-light-emitting low-energy-band-gap layer B1 is provided above the layer B3, the blue-light-emitting low-energy-band-gap layer B4 is provided above the layer B1, and operation voltage applied to the light-emitting element 300 of the third embodiment is increased from 3 V to 5 V and further to 7 V, the color of light emitted from the element 300 is changed from red to white to blue.

In the case where the blue-light-emitting low-energy-band-gap layer B4 is provided on the n-type semiconductor layer 104, the red-light-emitting low-energy-band-gap layer B1 is provided above the layer B4, the green-light-emitting low-energy-band-gap layer B3 is provided above the layer B1, and operation voltage applied to the light-emitting element 300 of the third embodiment is increased from 3 V to 5 V and further to 7 V, the color of light emitted from the element 300 is changed from red to white to green.

In the case where the blue-light-emitting low-energy-band-gap layer B4 is provided on the n-type semiconductor layer 104, the green-light-emitting low-energy-band-gap layer B3 is provided above the layer B4, the red-light-emitting low-energy-band-gap layer B1 is provided above the layer B3, and operation voltage applied to the light-emitting element 300 of the third embodiment is increased from 3 V to 5 V and further to 7 V, the color of light emitted from the element 300 is changed from green to white to red.

No particular limitation is imposed on the number of the low-energy-band-gap layers. That is, even when the number of the low-energy-band-gap layers is desirably or arbitrarily varied, to thereby produce a semiconductor light-emitting element, the resultant light-emitting element exhibits the effects of the present invention. No particular limitation is imposed on the wavelengths of light emitted from the low-energy-band-gap layers.

Similar to the case of the light-emitting element 100, in the semiconductor light-emitting element 300, the intensity of light emitted from the low-energy-band-gap layers may be regulated through the aforementioned means (M1) to (M7).

Fourth Embodiment

Figure 12:
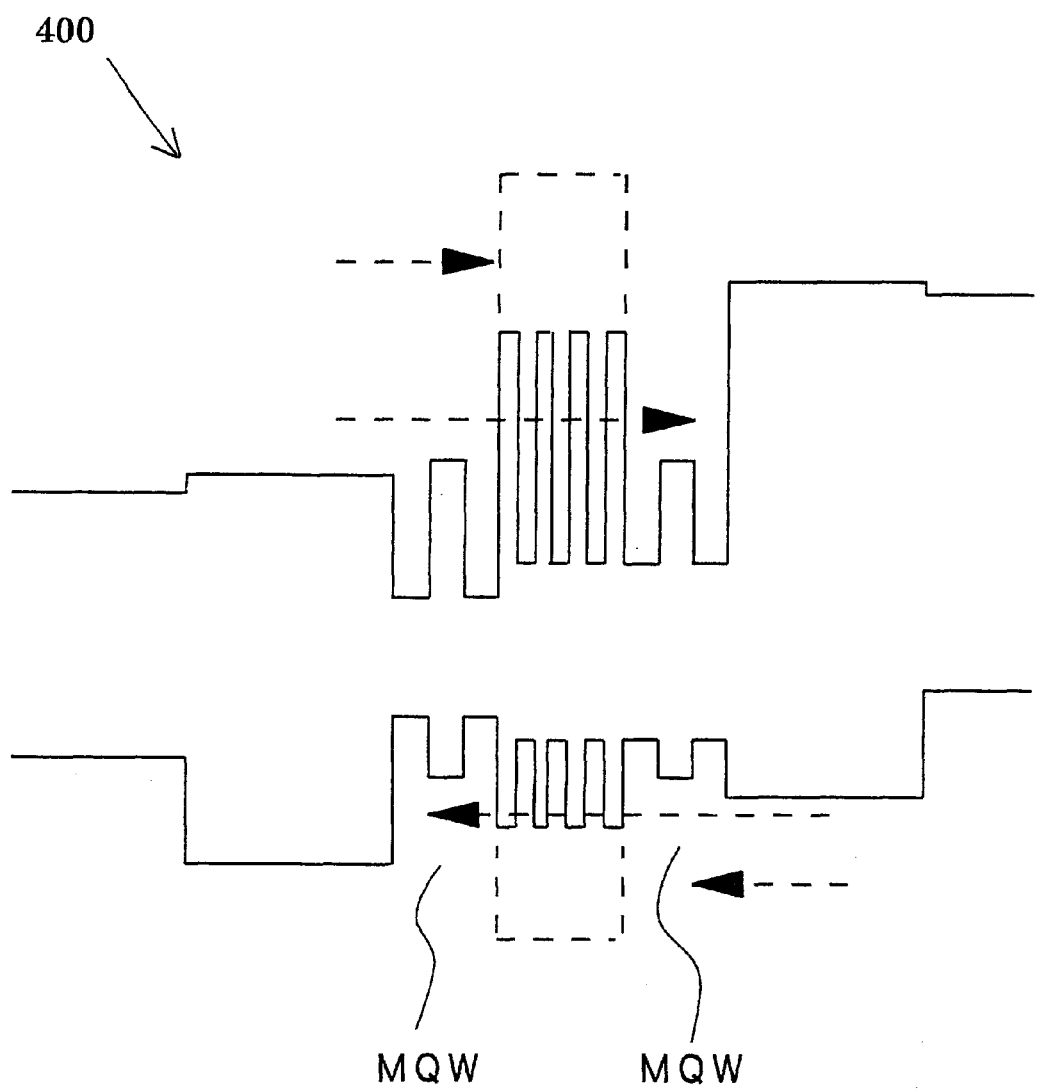
FIG. 12 schematically shows an energy band diagram of a semiconductor light-emitting element 400 of the fourth embodiment including a multiple layer containing light-emitting layers.
Figure 13A:
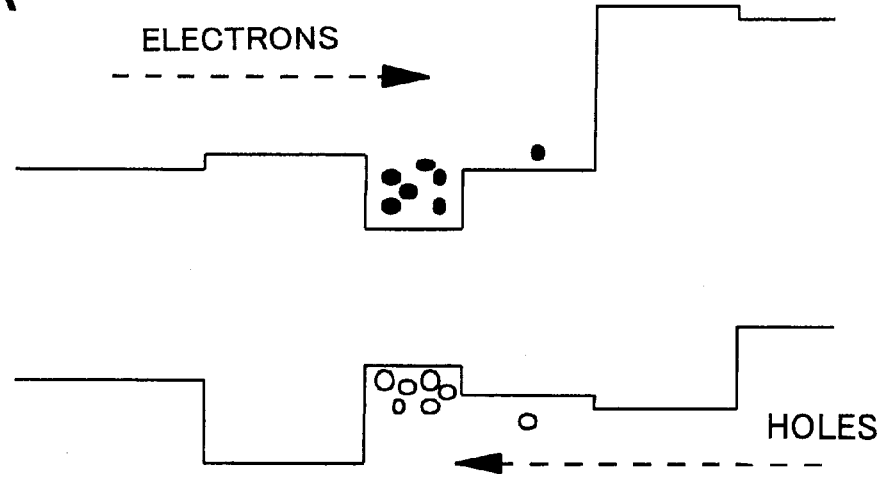
FIGS. 13A–13B show energy band diagrams of conventional semiconductor light-emitting elements, each containing two low-energy-band-gap layers which emit light of different wavelengths.
Figure 13B:
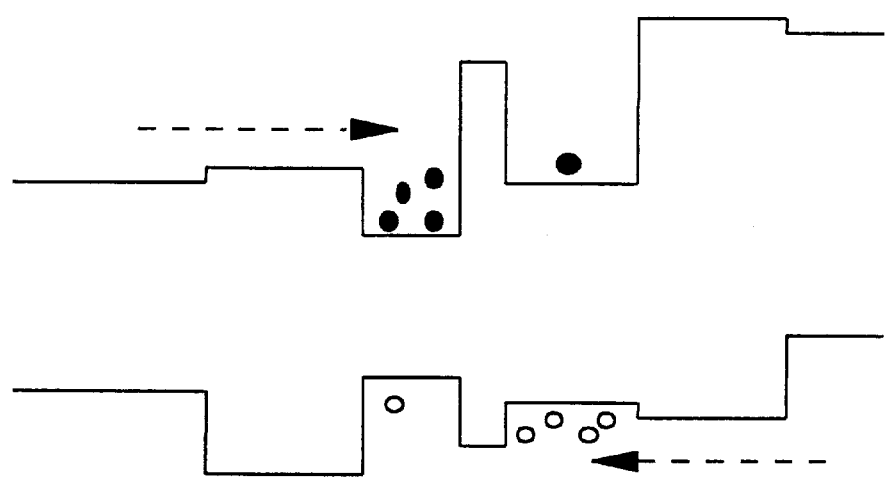

FIG. 12 schematically shows an energy band diagram of a semiconductor light-emitting element 400 of the fourth embodiment including a multiple layer containing light-emitting layers. When the present invention is carried out, as in the case of the semiconductor light-emitting element 400, low-energy-band-gap layers which sandwich a multiple quantum barrier-well layer may have a multiple quantum well (MQW) structure.

A barrier layer constituting the MQW structure may be formed of, for example, a GaN layer. Alternatively, the barrier layer may be formed of a layer having an energy band gap greater than that of the low-energy-band-gap layer, such as an AlGaN layer, an AlN layer, an AlInN layer, or an InAlGaN layer.

In the MQW structure of the light-emitting-layers-containing multiple layer of the light-emitting element of the present invention, electron waves may interfere with one another between the quantum-barrier-formation well layers. The low-energy-band-gap layers of the light-emitting element of the present invention may have a single quantum well (SQW) structure or a multiple quantum well (MQW) structure. Each of the low-energy-band-gap layers of the light-emitting element of the present invention may contain a thin barrier layer. The low-energy-band-gap layers of the light-emitting element of the present invention may interfere with one another.

The present invention may be applied to a semiconductor light-emitting element including low-energy-band-gap layers having such an arbitrary structure. That is, in the present invention, no particular limitation is imposed on the structure of the low-energy-band-gap layers, and the low-energy-band-gap layers may have an SQW structure or an MQW structure.

Therefore, low-energy-band-gap layers having known or arbitrary structure may be employed in the light-emitting element of the present invention, and the effects of the present invention can be obtained from the resultant light-emitting element.

When the compositional proportions, thicknesses, and number of semiconductor layers constituting the light-emitting-layers-containing multiple layer, and the type and amount of impurities added to the semiconductor layers are optimally or suitably regulated, mean coordinates (x, y) in terms of lightness corresponding to emitted light of different wavelengths can be regulated in the chromaticity diagram such that the mean coordinates substantially correspond to the coordinates of a white point W (⅓, ⅓).

The wavelength (emission spectrum) of light emitted from each of the low-energy-band-gap layers may be determined in accordance with the compositional proportions of the low-energy-band-gap layer, or the type and amount of an impurity added to the low-energy-band-gap layer.

Addition of impurities to a low-energy-band-gap layer is effective when light of relatively long wavelength is to be emitted from the low-energy-band-gap layer through donor to acceptor pair (DAP) emission. For example, when red light is to be emitted from the low-energy-band-gap layer, appropriate amounts of an acceptor impurity such as Zn or Mg and a donor impurity such as S, Si, or Te are added to the low-energy-band-gap layer. Impurities may be added to the low-energy-band-gap layer in order to attain bound-to-free (BF) emission or free-to-bound (FB) emission. Therefore, either of these acceptor and donor impurities may be added to the low-energy-band-gap layer.

For example, when red light is to be emitted from a low-energy-band-gap layer, the following means is effective or applicable: the low-energy-band-gap layer is formed from $Al_yIn_{1-y}N$ ($0 \leq y \leq 0.1$), and appropriate amounts of an acceptor impurity such as Zn or Mg and a donor impurity such as S, Si, or Te are added to the low-energy-band-gap layer during crystal growth of the layer. Through such means, without employing arsenic (As) or an arsenic compound which requires high-cost production equipment, there can be produced a light-emitting element which emits visible light of long wavelength (i.e., red light), which can reproduce a wide range of color, and which is suitable for use in a white illumination apparatus.

Examples of the acceptor impurity which may be employed include, in addition to zinc (Zn) and magnesium (Mg), Group II elements and Group IV elements, such as beryllium (Be), calcium (Ca), strontium (Sr), and barium (Ba). Examples of the donor impurity which may be employed include, in addition to sulfur (S), silicon (Si), and tellurium (Te), Group IV elements and Group VI elements, such as carbon (C), tin (Sn), and selenium (Se).

When such an acceptor impurity or a donor impurity is added to a low-energy-band-gap layer, the concentration of the impurity is preferably $1 \times 10^{17}/cm^3$ to $1 \times 10^{21}/cm^3$. For example, in the case of donor to acceptor pair (DAP) emission, so long as the concentration of each of the acceptor impurity and donor impurity falls within the above range, light emission occurs through electron transition between the energy levels of the impurities.

The emission intensities of low-energy-band-gap layers, and the proportions in emission intensity between the low-energy-band-gap layers can be regulated by varying the thicknesses of the low-energy-band-gap layers or the number of the layers. Alternatively, as described above, the emission intensities of low-energy-band-gap layers, and the proportions in emission intensity between the low-energy-band-gap layers can be regulated by optimally or suitably determining the transmittance of carriers which pass through multiple quantum barrier-well layers, or the reflectance of carriers which are reflected from the barrier-well layers.

As described above, the compositional proportions of low-energy-band-gap layers, and the types and amounts of impurities added to the low-energy-band-gap layers can be employed as parameters for determining the wavelengths of light emitted from the low-energy-band-gap layers. The thicknesses of low-energy-band-gap layers which emit light of different wavelengths and the number of the low-energy-band-gap layers can be employed as parameters for determining the intensities (chromaticities) of light emitted from the low-energy-band-gap layers.

Therefore, when the aforementioned parameters are optimally regulated in each of the low-energy-band-gap layers, through mixing of emitted light of different colors, an arbitrary color can be reproduced within a polygonal color reproduction profile formed by connecting chromaticity coordinates ($x_i$, $y_i$) corresponding to light emitted from the low-energy-band-gap layers.

That is, optimization of the aforementioned parameters easily attains efficient production of a semiconductor light-emitting element which emits white light.

When the compositional proportions, thicknesses, and number of the aforementioned impurity-added semiconductor layers, and the type and amount of impurities contained in the semiconductor layers are optimally or suitably regulated, mean coordinates (x, y) in terms of lightness corresponding to emitted light of different wavelengths can be regulated in the chromaticity diagram such that the mean coordinates substantially correspond to the coordinates of a white point W ($\frac{1}{3}$, $\frac{1}{3}$).

Through such regulation, efficiency in conversion of UV light to visible light and the amount of such conversion can be optimized. Therefore, emission efficiency of the light-emitting element can be improved, and the color of light emitted from the element can be easily converted to white.

When the order of lamination of light-emitting semiconductor layers is optimally or suitably regulated, mean coordinates (x, y) in terms of lightness corresponding to emitted light of different wavelengths can be regulated in the chromaticity diagram such that the mean coordinates substantially correspond to the coordinates of a white point W ($\frac{1}{3}$, $\frac{1}{3}$).

Examples of the material which may be employed for forming the substrate through crystal growth include, in addition to the aforementioned sapphire, known or arbitrary materials such as spinel, manganese oxide, lithium gallium oxide ($LiGaO_2$), molybdenum sulfide (MoS), silicon (Si), silicon carbide (SiC), GaN, AlN, GaAs, InP, GaP, MgO, ZnO, and $MgAl_2O_4$.

The material used for forming the aforementioned buffer layer 102 is not limited to AlN, but may be AlGaN, GaN, InAlGaN or a similar material.

When crystal growth is carried out by use of a bulk crystal substrate formed from, for example, gallium nitride (GaN), the aforementioned buffer layer is not necessarily provided.

Particularly when an electrically conductive substrate is employed, various known advantages related to an electrically conductive substrate may be obtained. For example, positive and negative electrodes can be formed such that the electrodes sandwich the substrate and a multiple layer containing light-emitting layers.

Obviously, numerous modifications and variations of the present invention are possible in light of the above teachings. It is therefore to be understood that within the scope of the appended claims, the present invention may be practiced otherwise than as specifically described herein.

What is claimed is:

1. A group III nitride compound semiconductor light-emitting element formed of Group III nitride compound semiconductor layers, comprising:
a multi-layer comprising a plurality of light-emitting layers;
a p-type semiconductor layer; and
an n-type semiconductor layer,
wherein the multi-layer comprises:
a multiple quantum barrier-well layer comprising:
a plurality of quantum-barrier-formation barrier layers comprising a Group III nitride compound semiconductor; and
a plurality of quantum-barrier-formation well layers comprising a Group III nitride compound semiconductor, the barrier layers and the well layers being formed alternately and cyclically; and
a plurality of low-energy-band-gap layers which emit light of different wavelengths, the multiple quantum barrier-well layer being provided between the low-energy-band-gap layers, and the multiple quantum barrier-well layer not emitting light.

2. A Group III nitride compound semiconductor light-emitting element according to claim 1, wherein each of the quantum-barrier-formation barrier layers has a band gap larger than that corresponding to the wavelength of light emitted from each of the low-energy-band-gap layers.

3. A Group III nitride compound semiconductor light-emitting element according to claim 1, wherein each of the quantum-barrier-formation well layers or each of the quantum-barrier-formation barrier layers has a thickness of 0.5 nm to 10 nm inclusive.

4. A Group III nitride compound semiconductor light-emitting element according to claim 2, wherein each of the quantum-barrier-formation well layers or each of the quantum-barrier-formation barrier layers has a thickness of 0.5 nm to 10 nm inclusive.

5. A Group III nitride compound semiconductor light-emitting element according to claim 1, wherein the quantum-barrier-formation well layers comprising $Al_xGa_yIn_{1-x-y}N$ ($0 \leq x<0.1$, $0.8<y<1$, $0<1-x-y<0.1$).

6. A Group III nitride compound semiconductor light-emitting element according to claim 2, wherein the quantum-barrier-formation well layers comprise $Al_xGa_yIn_{1-x-y}N$ ($0 \leq x<0.1$, $0.8<y<1$, $0<1-x-y<0.1$).

7. A Group III nitride compound semiconductor light-emitting element according to claim 3, wherein the quantum-barrier-formation well layers comprise $Al_xGa_yIn_{1-x-y}N$ ($0 \leq x<0.1$, $0.8<y<1$, $0<1-x-y<0.1$).

8. A Group III nitride compound semiconductor light-emitting element according to claim 1, wherein the quantum-barrier-formation well layers comprise $Al_xGa_{1-x}N$ ($0 \leq x<0.5$).

9. A Group III nitride compound semiconductor light-emitting element according to claim 2, wherein the quantum-barrier-formation well layers comprise $Al_xGa_{1-x}N$ ($0 \leq x<0.5$).

10. A Group III nitride compound semiconductor light-emitting element according to claim 3, wherein the quantum-barrier-formation well layers comprise $Al_xGa_{1-x}N$ ($0 \leq x<0.5$).

11. A Group III nitride compound semiconductor light-emitting element according to claim 4, wherein the quantum-barrier-formation well layers comprise $Al_xGa_{1-x}N$ ($0 \leq x<0.5$).

12. A Group III nitride compound semiconductor light-emitting element according to claim 5, wherein the quantum-barrier-formation barrier layers comprise $Al_xGa_{1-x}N$ ($0 \leq x<0.5$).

13. A Group III nitride compound semiconductor light-emitting element according to claim 1, wherein the color of emitted light is changed by varying operation voltage.

14. A Group III nitride compound semiconductor light-emitting element according to claim 1, further comprising:

a phosphor which receives light emitted from a low-energy-band-gap layer and emits light having a wavelength longer than that of the light emitted from the low-energy-band-gap layer.

15. A Group III nitride compound semiconductor light-emitting element according to claim 1, further comprising:

an impurity-added semiconductor layer which receives light emitted from a low-energy-bamd-gap layer in said plurality of low-energy-band-gap layers and emits light having a wavelength longer than that of the light emitted from the low-energy-band-gap layer.

16. A Group III nitride compound semiconductor light-emitting element according to claim 15, wherein the impurity-added semiconductor layer comprises, as an impurity, at least one element selected from among silicon (Si), sulfur (S), selenium (Se), tellurium (Te), and germanium (Ge).

17. A Group III nitride compound semiconductor light-emitting element according to claim 16, wherein the impurity-added semiconductor layer serves as one of an n-type semiconductor layer, an n-type contact layer, and a high-carrier-concentration $n^+$ layer, and one of electrode formation and electrode connection is carried out through a flip chip process such that light is extracted through a substrate.

18. A Group III nitride compound semiconductor light-emitting element according to claim 1, wherein the light-emitting semiconductor layers are formed such that a semiconductor layer which emits light of a shorter wavelength is provided closer to a light extraction side of the light-emitting element.

19. A group III nitride compound semiconductor light-emitting element, comprising:

an n-type semiconductor layer;

a multi-layer formed on said n-type semiconductor layer, comprising:

a plurality of low-energy-band-gap layers which emit light of different wavelengths; and a multiple quantum barrier-well layer formed between said low-energy-band-gap layers, and comprising:

a plurality of quantum-barrier-formation barrier layers comprising a Group III nitride compound semiconductor; and a plurality of quantum-barrier-formation well layers comprising a Group III nitride compound semiconductor, and being alternately formed with said barrier layers; and a p-type semiconductor layer formed on said multi-layer.

20. A light-emitting device comprising the group III nitride compound semiconductor light-emitting element according to claim 19.

* * * * *